(12) United States Patent
Okita

(10) Patent No.: US 11,564,323 B2
(45) Date of Patent: Jan. 24, 2023

(54) CASE OPENING RECORDING APPARATUS AND CASE OPENING RECORDING SYSTEM THAT RECORD WHETHER OR NOT CASE IS REMOVED FROM CIRCUIT BOARD

(71) Applicant: FANUC CORPORATION, Yamanashi (JP)

(72) Inventor: Hiroshi Okita, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 476 days.

(21) Appl. No.: 16/797,047

(22) Filed: Feb. 21, 2020

(65) Prior Publication Data

US 2020/0275573 A1  Aug. 27, 2020

(30) Foreign Application Priority Data

Feb. 26, 2019 (JP) .............................. JP2019-033031

(51) Int. Cl.
*H05K 7/14* (2006.01)
*H02J 9/06* (2006.01)
(Continued)

(52) U.S. Cl.
CPC ......... *H05K 7/1427* (2013.01); *G05B 19/408* (2013.01); *G07C 9/00706* (2013.01);
(Continued)

(58) Field of Classification Search
CPC .. H05K 7/1427; H05K 5/0208; H05K 7/1481; G05B 19/408; G05B 2219/42301;
(Continued)

(56) References Cited

U.S. PATENT DOCUMENTS 4,122,359 A * 10/1978 Breikss .................. G11C 5/141
307/64
5,880,523 A * 3/1999 Candelore ............... G06F 21/86
257/691
(Continued)

FOREIGN PATENT DOCUMENTS

JP  H10295916 A  11/1998
JP  H11167404 A  6/1999
(Continued)

*Primary Examiner* — Edwin C Holloway, III
(74) *Attorney, Agent, or Firm* — Hauptman Ham, LLP

(57) ABSTRACT

A case opening recording apparatus which, in a mechanical apparatus having a circuit board provided with an electric circuit, and a case capable of housing the circuit board, records whether or not the case is removed from the circuit board, and the case opening recording apparatus includes: a current path provided in the case; an auxiliary power supply provided in either the circuit board or the case and different from a main drive power supply of the mechanical apparatus; a state holding unit in which a state signal to be held is switched when received voltage changes; and a connection unit configured to electrically connect the auxiliary power supply to the state holding unit via the current path when the circuit board is housed in the case, and electrically disconnect the auxiliary power supply from the state holding unit when the circuit board is not housed in the case.

11 Claims, 12 Drawing Sheets

(51) Int. Cl.
 *G05B 19/408* (2006.01)
 *G07C 9/38* (2020.01)
 *H05K 5/02* (2006.01)
 *G07C 9/00* (2020.01)
(52) U.S. Cl.
 CPC ........... *G07C 9/00714* (2013.01); *G07C 9/38* (2020.01); *H02J 9/06* (2013.01); *H05K 5/0208* (2013.01); *G05B 2219/42301* (2013.01)
(58) Field of Classification Search
 CPC ............... G05B 19/4063; G05B 19/18; G05B 2219/24158; G07C 9/00706; G07C 9/00714; G07C 9/38; G07C 3/14; G07C 3/143; H02J 9/06; B41J 29/38; B41J 29/387; B41J 29/393; B41J 2029/393; G01R 31/50; H01H 2071/7472; H01H 2239/032
 USPC .............. 318/667; 340/539.31, 545.6, 693.2; 361/654, 672, 719, 720, 732, 736, 747, 361/759
 See application file for complete search history.

(56) References Cited

U.S. PATENT DOCUMENTS

| | | | | |
|---|---|---|---|---|
| 5,945,915 A | * | 8/1999 | Cromer | ................ G08B 29/046 340/568.4 |
| 6,067,027 A | * | 5/2000 | Buer | ....................... G06F 1/266 340/687 |
| 2007/0013574 A1 | * | 1/2007 | Igarashi | ............. G01D 5/24404 341/173 |
| 2009/0140869 A1 | * | 6/2009 | Crockett | ................ B41J 29/393 340/635 |
| 2010/0134821 A1 | * | 6/2010 | Wasamoto | ............... G07G 5/00 358/1.14 |
| 2010/0169671 A1 | * | 7/2010 | Coussieu | ................ G06F 21/75 713/193 |
| 2010/0301994 A1 | * | 12/2010 | Wasamoto | ............. B41J 29/393 340/5.2 |
| 2011/0154077 A1 | * | 6/2011 | Wasamoto | ............... G07G 5/00 713/322 |
| 2012/0131680 A1 | * | 5/2012 | Baba | ..................... G07F 19/205 726/26 |
| 2017/0363673 A1 | | 12/2017 | Mukherjee | |

FOREIGN PATENT DOCUMENTS

| | | |
|---|---|---|
| JP | 2004194890 A | 7/2004 |
| JP | 200750604 A | 3/2007 |
| JP | 2010134580 A | 6/2010 |
| JP | 2010151741 A | 7/2010 |
| JP | 2014213400 A | 11/2014 |
| JP | 5766762 B2 | 8/2015 |

* cited by examiner

CASE OPENING RECORDING APPARATUS AND CASE OPENING RECORDING SYSTEM THAT RECORD WHETHER OR NOT CASE IS REMOVED FROM CIRCUIT BOARD

RELATED APPLICATIONS

The present application claims priority of Japanese Application Number 2019-033031 filed Feb. 26, 2019, the disclosure of which is hereby incorporated by reference herein in its entirety.

BACKGROUND OF THE INVENTION

1. Field of Invention

The present invention relates to a case opening recording apparatus and a case opening recording system that record whether or not a case is removed from a circuit board.

2. Description of the Related Art

In an amplifier (servo amplifier) or the like (hereinafter, simply referred to as a "mechanical apparatus" in some cases) which supplies drive power to a numerical control apparatus or a motor of a machine tool, an electric circuit configuring a control unit is generally provided on a circuit board. This circuit board is covered with a case for the purpose of protecting the electric circuit, ensuring appearance, and the like.

In a mechanical apparatus such as an amplifier which supplies drive power to a numerical control apparatus or a motor of a machine tool, a circuit board provided with an electric circuit is covered with a case, and therefore, it is required to remove the case from the circuit board when the circuit board is to be touched for the purpose of maintenance or the like. Maintenance of a mechanical apparatus is performed by a maintenance worker who has specialized knowledge about a mechanical apparatus such as a numerical control apparatus or an amplifier and who has learned much about maintenance procedures, for example, a worker who belongs to a maintenance division of a manufacturer of the mechanical apparatus, a worker who has maintenance authority among employees in a customer service office in which the mechanical apparatus is utilized. A well-trained maintenance worker performs maintenance of a mechanical apparatus, and thereby, it is possible to prevent any failure of the mechanical apparatus, reduce occurrence of product defects manufactured by the mechanical apparatus, or ensure safety of employees in the customer service office in which the mechanical apparatus is utilized.

For example, as described in Japanese Unexamined Patent Publication No. 2010-151741, there is known a vibration detection apparatus which electrically detects vibration of a mechanical apparatus in a state where external power supply is blocked, the vibration detection apparatus including a power supply means including a capacitor or a secondary battery, a vibration detection means for, when vibration equal to or more than a predetermined vibration level is applied to the mechanical apparatus, detecting the vibration via a MEMS switch, a vibration history storage means for storing, via an electric circuit as a vibration history, the presence or absence of vibration detected by the vibration detection means, a vibration history determination means for determining vibration generation from the presence or absence of a vibration history stored in the vibration history storage means, in a state where power is externally supplied to the mechanical apparatus, and an activation stop means for inhibiting activation of the mechanical apparatus when the vibration generation is determined by the vibration history determination means.

For example, as is known from Japanese Patent No. 5766762, there is a numerical control apparatus which controls a machine tool having a plurality of movable shafts, the numerical control apparatus including an operation pattern storage means for previously storing a plurality of sets of set values including setting of override of a rapid traverse speed of the movable shaft, setting of override of a cutting feed speed, setting of override of a main shaft rotation speed, valid/invalid setting of movement of the movable shaft, and valid/invalid setting of an M-S-T function, and an operation pattern selection means for selecting the operation pattern in response to an input signal from at least either the machine tool or an external device connected to the machine tool, from among a plurality of sets of set values stored in the operation pattern storage means, wherein the machine tool is controlled on the basis of a set value selected by the operation pattern selection means.

SUMMARY OF INVENTION

For example, when a person other than a maintenance worker inadvertently performs maintenance of a circuit board, there is a possibility that a mechanical apparatus may fail. Moreover, for example, there is a possibility that a person other than a maintenance worker or a third party who is not at all concerned with a customer service office in which the mechanical apparatus is utilized may maliciously alter or break a circuit board. Further, for example, there is also a possibility that a mechanical apparatus may fail due to a mistake in maintenance work by a maintenance worker. When a circuit board is to be touched, it is required to remove a case from the circuit board, but when the circuit board is again covered with the case after the case is removed from the circuit board and then some work is done on the circuit board, no change appears in the exterior of the mechanical apparatus (more specifically, the exterior of the case of the mechanical apparatus) before and after the series of operations. Thus, the maintenance worker who repairs the mechanical apparatus may not be able to discern whether a failure of the mechanical apparatus is attributed to work (including both formal maintenance work by the maintenance worker, and some work on the circuit board by a person other than the maintenance worker or a third party) done after the manufacture of the mechanical apparatus, or merely attributed to an initial error which has already occurred at the manufacture of the mechanical apparatus.

Furthermore, for the purpose of alteration prevention of a circuit board housed in a case of the mechanical apparatus, and confidentiality, a contract between the manufacturer of the mechanical apparatus and the customer service office in which the mechanical apparatus is utilized indicates that the case is not removed from the circuit board in the customer service office. However, when the circuit board is again covered with the case after the case is removed from the circuit board and then some work is done on the circuit board, no change appears in the exterior of the mechanical apparatus before and after the series of operations, and therefore, there is a possibility that the removal of the case from the circuit board against the contract may be overlooked.

Therefore, in a mechanical apparatus having a circuit board provided with an electric circuit and a case capable of housing the circuit board, a technique which can check whether or not the case is removed from the circuit board is desired.

According to one aspect of the present disclosure, a case opening recording apparatus, in a mechanical apparatus having a circuit board provided with an electric circuit and a case capable of housing the circuit board, records whether or not the case is removed from the circuit board, and the case opening recording apparatus includes: a current path provided in the case; an auxiliary power supply provided in either the circuit board or the case and different from a main drive power supply of the mechanical apparatus; a state holding unit in which a state signal to be held is switched when received voltage changes; and a connection unit configured to electrically connect the auxiliary power supply to the state holding unit via the current path when the circuit board is housed in the case, and electrically disconnect the auxiliary power supply from the state holding unit when the circuit board is not housed in the case.

Furthermore, according to one aspect of the present disclosure, a case opening recording system includes: the plurality of case opening recording apparatuses provided in relation to a plurality of mechanical apparatuses; a communication network configured to communicably connect each of the case opening recording apparatuses; and an upper controller which is communicably connected to the communication network, and controls an operation of each of the plurality of mechanical apparatuses, wherein the upper controller has an overall recording unit configured to record information indicating that the case is removed from the circuit board in the mechanical apparatus when the state holding unit of the case opening recording apparatus relevant to each of the plurality of mechanical apparatuses holds a state signal different from a state signal held when the auxiliary power supply and the state holding unit are electrically connected to each other by the connection unit via the current path.

BRIEF DESCRIPTION OF DRAWINGS

The present invention will be more clearly understood with reference to the following accompanying drawings.

DETAILED DESCRIPTION

Figure 1A:
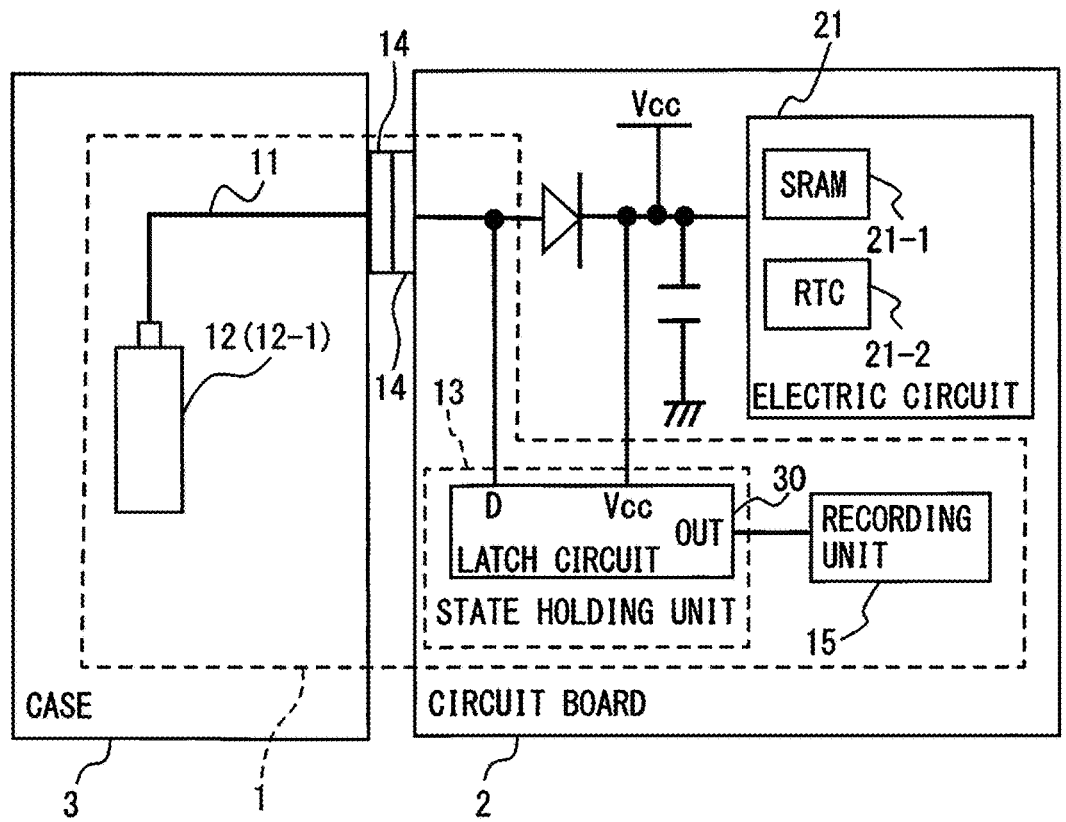
FIG. 1A is a schematic diagram illustrating a configuration of a case opening recording apparatus according to a first embodiment of the present disclosure, and illustrates a case where a case is attached to a circuit board.

Hereinafter, a case opening recording apparatus and a case opening recording system that record whether or not a case is removed from a circuit board is described with reference to the drawings. In order to facilitate understanding, these drawings are suitably varied in scale. A mode illustrated in the drawings is one example of embodiment, and the present invention is not limited to embodiments illustrated in the drawings.

A case opening recording apparatus according to an embodiment of the present disclosure includes a current path provided in a case, an auxiliary power supply provided in either a circuit board or the case and different from a main drive power supply of the mechanical apparatus, a state holding unit in which a state signal to be held is switched when received voltage changes, and a connection unit configured to electrically connect the auxiliary power supply to the state holding unit via the current path when the circuit board is housed in the case, and electrically disconnect the auxiliary power supply from the state holding unit when the circuit board is not housed in the case. The mechanical apparatus includes a numerical control apparatus of a machine tool, or an amplifier configured to supply drive power to a motor. Several embodiments are listed below.

First, a case opening recording apparatus according to a first embodiment is described.

According to the first embodiment, as an auxiliary power supply different from a main drive power supply of a mechanical apparatus, a battery serving as a backup power supply of an electric circuit provided on a circuit board at off-time of a main drive power supply is provided in a case.

Figure 1B:
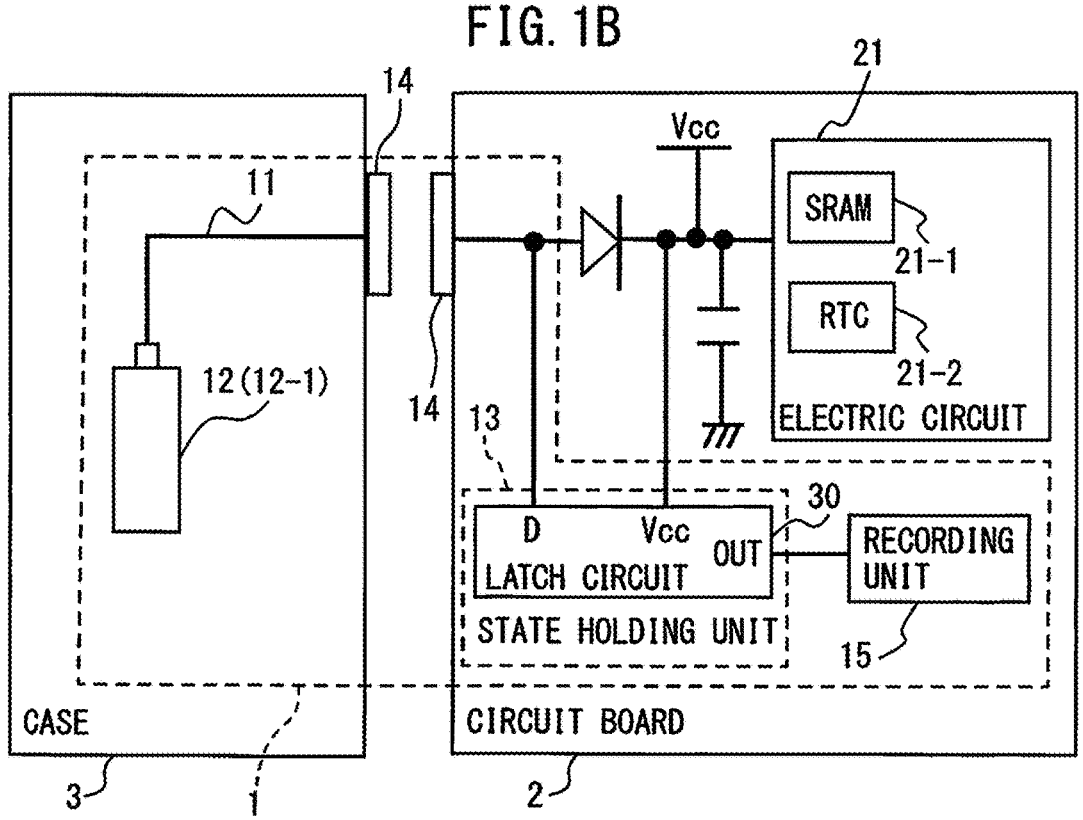
FIG. 1B is a schematic diagram illustrating the configuration of the case opening recording apparatus according to the first embodiment of the present disclosure, and illustrates a case where the case is removed from the circuit board.
Figure 2A:
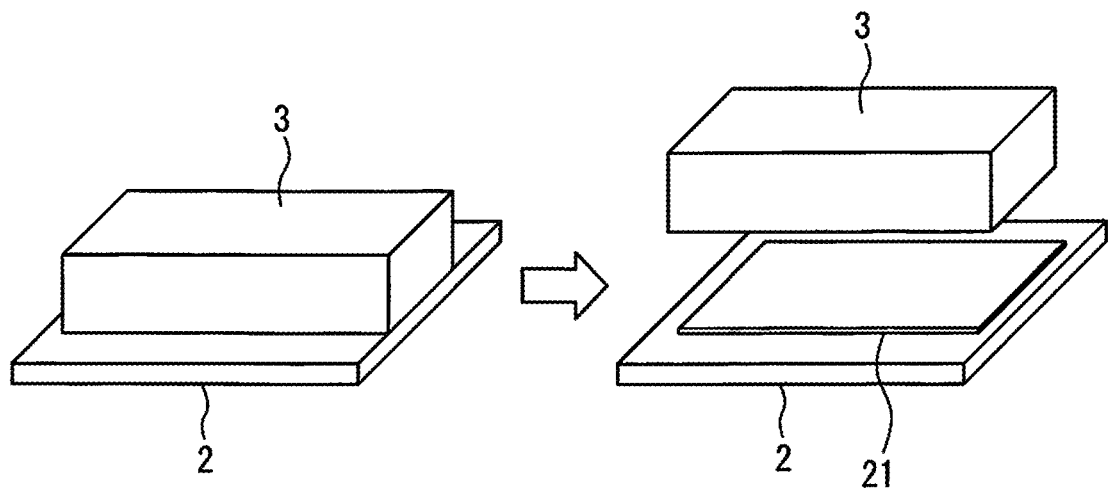
FIG. 2A is a perspective view illustrating a relation between the circuit board and the case, and illustrates a type in which a circuit board is covered with a case.
Figure 2B:
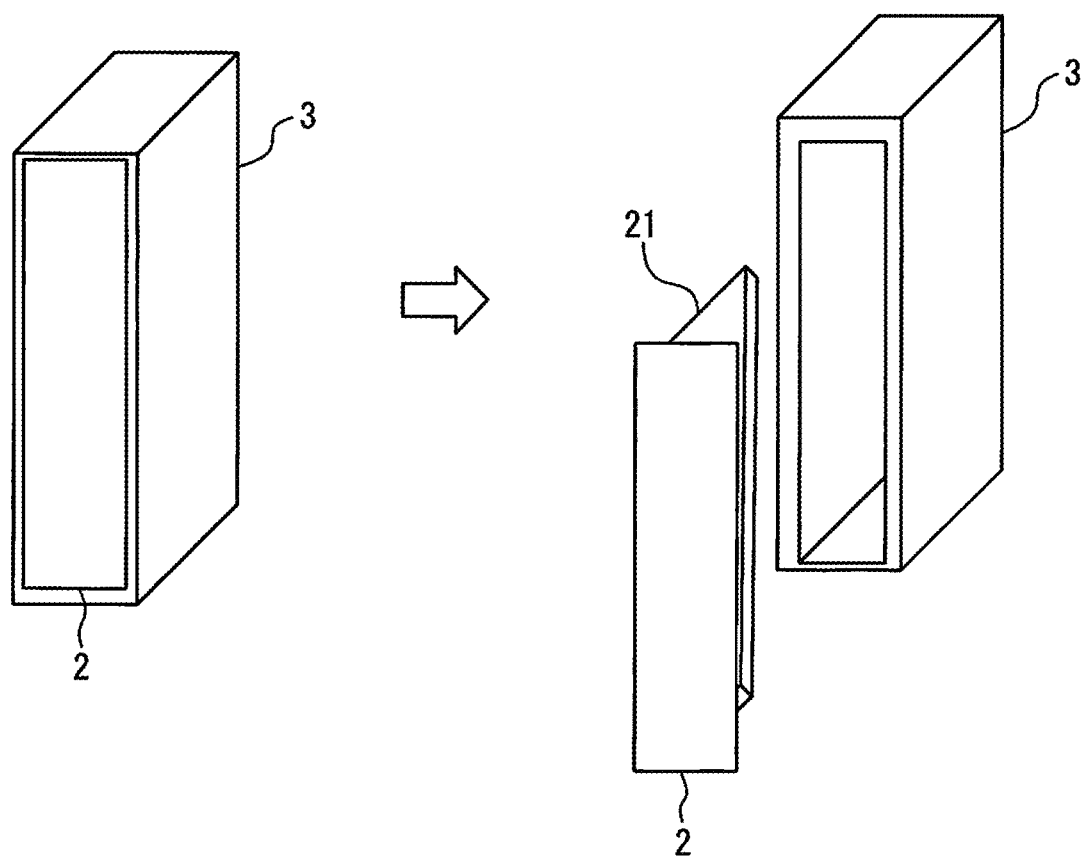
FIG. 2B is a perspective view illustrating a relation between the circuit board and the case, and illustrates a type in which a slot-shaped circuit board is housed in a case.

FIG. 1A is a schematic diagram illustrating a configuration of the case opening recording apparatus according to the first embodiment of the present disclosure, and illustrates a case where a case is attached to a circuit board. FIG. 1B is a schematic diagram illustrating the configuration of the case opening recording apparatus according to the first embodiment of the present disclosure, and illustrates a case where the case is removed from the circuit board. FIG. 2A is a perspective view illustrating a relation between the circuit board and the case, and illustrates a type in which a circuit board is covered with a case. FIG. 2B is a perspective view illustrating a relation between the circuit board and the case, and illustrates a type in which a slot-shaped circuit board is housed in a case.

As illustrated in FIG. 2A, in a mechanical apparatus of a type in which a circuit board 2 provided with an electric circuit 21 is covered with a case 3, the electric circuit 21 is cut off from external space when the circuit board 2 is covered with the case 3, and the electric circuit 21 is exposed when the case 3 is removed from the circuit board 2. As illustrated in FIG. 2B, in a mechanical apparatus of a type in which a slot-shaped circuit board is housed in a case, the electric circuit 21 is cut off from external space when the slot-shaped circuit board 2 is inserted into the case 3, and the electric circuit 21 is exposed when the case 3 is pulled out from the slot-shaped circuit board 2. A case opening recording apparatus 1 according to each of the first embodiment described here and other embodiments described later is also applicable to the mechanical apparatus of each of the types illustrated in FIGS. 2A and 2B.

As illustrated in FIGS. 1A and 1B, the case opening recording apparatus 1 according to the first embodiment includes a current path 11 provided in a case 3, a battery 12-1 which is an auxiliary power supply 12 provided in the case 3, a state holding unit 13, a connection unit 14, and a recording unit 15.

According to the first embodiment, the auxiliary power supply 12 is the battery 12-1 serving as a backup power supply of the electric circuit 21 provided on the circuit board 2 at off-time of a main drive power supply Vcc of the mechanical apparatus. The electric circuit 21 includes, for example, a storage device such as a Static Random Access Memory (SRAM) (indicated with the reference sign 21-1), a real-time clock (RTC) 21-2, and the like. A diode and a capacitor are provided at an input stage of the electric circuit 21 in preparation for off-time of the main drive power supply Vcc of the mechanical apparatus. Although the SRAM 21-1 and the real-time clock 21-2 are illustrated here as one example of the electric circuit 21 which receives supply of backup power from the battery 12-1 at off-time of the main drive power supply Vcc of the mechanical apparatus, the electric circuit 21 may be an electronic component other than those components. The SRAM 21-1 is a volatile memory which loses stored contents when becoming free of supply of power, and is thus required to receive supply of power from the battery 12-1 in order to be able to hold the stored contents even at off-time of the main drive power supply Vcc of the mechanical apparatus. Moreover, the real-time clock 21-2 stops a clock operation when becoming free of supply of power, and is thus required to receive supply of power from the battery 12-1 in order to be able to advance a clock even at off-time of the main drive power supply Vcc of the mechanical apparatus. While the case 3 is attached to the circuit board 2 as illustrated in FIG. 1A, the electric circuit 21 including the SRAM 21-1 and the real-time clock 21-2 receives, via the current path 11 and the connection unit 14, supply of power from the battery 12-1 as backup power at off-time of the main drive power supply Vcc of the mechanical apparatus. When the case 3 is removed from the circuit board 2 as illustrated in FIG. 1B, the electric circuit 21 including the SRAM 21-1 and the real-time clock 21-2 does not receive supply of power from the battery 12-1 at off-time of the main drive power supply Vcc of the mechanical apparatus, and therefore, the stored contents are erased in the SRAM 21-1, and the real-time clock 21-2 stops the clock operation.

The state holding unit 13 is provided between the connection unit 14 and the electric circuit 21 on the circuit board 2. The state holding unit 13 is configured by a latch circuit 30 in which a state signal to be held is switched when received voltage changes. The latch circuit 30 operates by receiving, at a Vcc terminal (power input terminal), drive power supplied from the battery 12-1, and holds (latches) a state signal according to voltage applied to a D input terminal (i.e., voltage between the connection unit 14 and the electric circuit 21). The operation of the state holding unit 13 configured by the latch circuit 30 is described together with the following operations of the connection unit 14 and the recording unit 15.

The connection unit 14 electrically connects the battery 12-1 being the auxiliary power supply 12 to the latch circuit 30 being the state holding unit 13 as well as the electric circuit 21 via the current path 11 when the circuit board 2 is housed in the case 3, and electrically disconnects the battery 12-1 being the auxiliary power supply 12 from the latch circuit 30 being the state holding unit 13 as well as the electric circuit 21 when the circuit board 2 is not housed in the case 3. The connection unit 14 is configured by a publicly known positive electrode connector terminal and a negative electrode connector terminal (ground terminal) with which the battery 12-1 provided in the case 3 is electrically connected to the electric circuit 21 and the state holding unit 13 provided on the circuit board 2 along with physical connection between the case 3 and the circuit board 2. The connection unit 14 is configured by, for example, a male-female-shaped connector terminal, and is configured by, for example, a pin-type connector terminal particularly in the case of a slot-shaped circuit board 2.

The connection unit 14 electrically connects the battery 12-1 being the auxiliary power supply 12 to the latch circuit 30 being the state holding unit 13 as well as the electric circuit 21 via the current path 11 when the circuit board 2 is housed in the case 3 as illustrated in FIG. 1A. When the circuit board 2 is housed in the case 3, the electric circuit 21 and the latch circuit 30 receive supply of power from the battery 12-1 via the current path 11 and the connection unit 14 at off-time of the main drive power supply Vcc of the mechanical apparatus.

Furthermore, the connection unit 14 electrically disconnects the battery 12-1 being the auxiliary power supply 12 from the latch circuit 30 being the state holding unit 13 as well as the electric circuit 21 when the circuit board 2 is not housed in the case 3 (when the case 3 is removed from the circuit board 2) as illustrated in FIG. 1B. Accordingly, the electric circuit 21 and the latch circuit 30 do not receive supply of power from the battery 12-1 via the current path 11 and the connection unit 14. When the case 3 is removed from the circuit board 2, voltage applied to the D input terminal of the latch circuit 30 (i.e., voltage between the connection unit 14 and the electric circuit 21) changes to "LOW", and therefore, the latch circuit 30 holds (latches) a state signal different from a state signal held when the battery 12-1 and the latch circuit 30 are electrically connected to each other by the connection unit 14 via the current path 11 (i.e., when the circuit board 2 is housed in the case 3). In other words, when the latch circuit 30 holds a state signal different from a state signal held when the battery 12-1 and the latch circuit 30 are electrically connected to each other via the current path 11 (i.e., when the circuit board 2 is housed in the case 3), this means that the case 3 is removed from the circuit board 2.

The recording unit 15 is provided on the circuit board 2. When the main drive power supply Vcc of the mechanical apparatus is switched from off to on, the recording unit 15 records a state signal held by the latch circuit 30 being the state holding unit 13. The recording unit 15 preferably holds stored contents even at off-time of the main drive power supply Vcc of the mechanical apparatus, and is thus configured by a non-volatile memory such as an EEPROM.

While the circuit board 2 is housed in the case 3 as illustrated in FIG. 1A, the battery 12-1 is electrically connected to the latch circuit 30 being the state holding unit 13 as well as the electric circuit 21 via the current path 11 and the connection unit 14, and therefore, the latch circuit 30 and the electric circuit 21 receive supply of power from the battery 12-1 even at off-time of the main drive power supply Vcc of the mechanical apparatus. Thus, while the circuit board 2 is housed in the case 3 as illustrated in FIG. 1A, the latch circuit 30 holds a first state signal relevant to "HIGH" being voltage applied to the D input terminal (i.e., voltage between the connection unit 14 and the electric circuit 21).

When the case 3 is removed from the circuit board 2 as illustrated in FIG. 1B, voltage applied to the D input terminal of the latch circuit 30 (i.e., voltage between the connection unit 14 and the electric circuit 21) changes from "HIGH" to "LOW", and therefore, the latch circuit 30 holds (latches) a second state signal different from the first state signal held when the battery 12-1 and the latch circuit 30 are electrically connected to each other by the connection unit 14 via the current path 11 (i.e., when the circuit board 2 is housed in the case 3).

In this way, the latch circuit 30 holds the first state signal while the circuit board 2 is housed in the case 3 as illustrated in FIG. 1A (i.e., while the case 3 has never been removed from the circuit board 2), and the latch circuit 30 holds the second state signal when the case 3 is removed from the circuit board 2 even once as illustrated in FIG. 1B. When the main drive power supply Vcc of the mechanical apparatus is switched from off to on, the recording unit 15 records a state signal held by the latch circuit 30 being the state holding unit 13, and therefore, whether or not the case 3 is removed from the circuit board 2 can be determined by determining whether a state signal recorded in the recording unit 15 is the first state signal or the second state signal. In other words, when the first state signal is recorded in the recording unit 15, this indicates that the case 3 has never been removed from the circuit board 2, and when the second state signal is recorded in the recording unit 15, this indicates that the case 3 is removed from the circuit board 2. In this way, the case opening recording apparatus 1 can record whether or not the case 3 is removed from the circuit board 2, in a mechanical apparatus having the circuit board 2 provided with the electric circuit 21, and the case 3 capable of housing the circuit board 2. A result recorded in the recording unit 15 may be further displayed, for example, on a display (not illustrated), or may be displayed by the presence or absence of lighting of a lamp (not illustrated). For example, "case is removed from circuit board" or "case is not removed from circuit board" can be displayed on a display attached to a mechanical apparatus or a display of a device independent from a mechanical apparatus. Moreover, for example, lighting of the lamp can be related to "case is removed from circuit board", and non-lighting of the lamp can be related to "case is not removed from circuit board". Further, information recorded in the recording unit 15 may be further saved as a log in an upper recording apparatus (not illustrated).

Note that, when the main drive power supply Vcc of the mechanical apparatus is switched from off to on, reset processing of the latch circuit 30 is preferably performed in addition to the above-described recording processing by the recording unit 15. By performing the reset processing of the latch circuit 30, the case opening recording apparatus 1 can again execute the above-described processing, and can continue recording of whether or not the case 3 is removed from the circuit board 2.

Note that voltage applied to the D input terminal of the latch circuit 30 is also dropped by a voltage drop of the battery 12-1, but, for example, voltage of the battery 12-1 can be separately measured, and therefore, it is possible to discern whether a cause that the latch circuit 30 holds the second state signal (the recording unit 15 records the second state signal) is due to the fact that the case 3 is removed from the circuit board 2 or due to a voltage drop of the battery 12-1.

Figure 3:
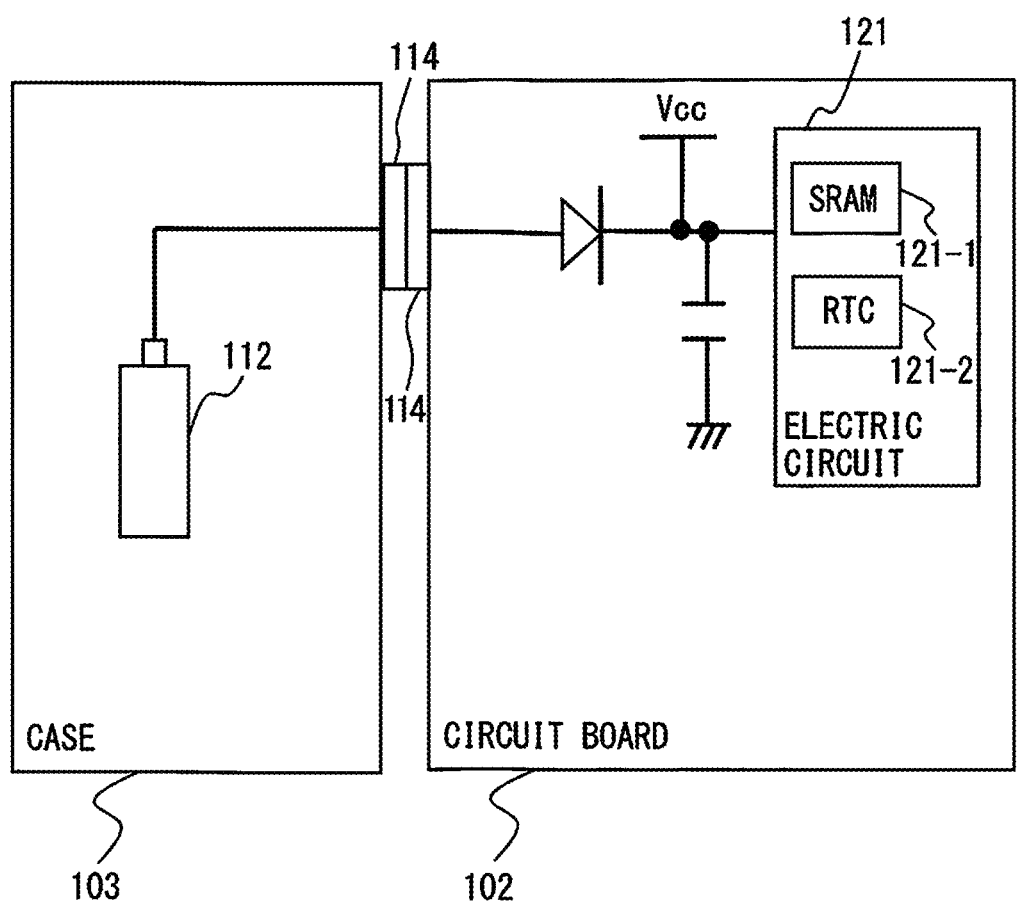
FIG. 3 is a schematic diagram illustrating a mechanical apparatus according to a conventional example in which a battery serving as a backup power supply is provided on a case side.

FIG. 3 is a schematic diagram illustrating a mechanical apparatus according to a conventional example in which a battery serving as a backup power supply is provided on a case side. As illustrated in FIG. 3, in the mechanical apparatus according to the conventional example in which a battery 112 is provided in a case 103, and an electric circuit 121 including an SRAM 121-1 and a real-time clock (RTC) 121-2 is provided on a circuit board 102, a configuration which records whether or not the case 103 is removed from the circuit board 102 is not provided, no change appears in the exterior of the mechanical apparatus before and after the removal of the case 103, and therefore, it is not possible to check whether or not the case 103 is removed from the circuit board 102. In contrast, the case opening recording apparatus 1 according to the first embodiment can record whether or not the case 3 is removed from the circuit board 2.

Next, a case opening recording apparatus according to a second embodiment is described.

According to the second embodiment, as an auxiliary power supply different from a main drive power supply of a mechanical apparatus, a battery serving as a backup power supply of an electric circuit provided on a circuit board at off-time of the main drive power supply is provided on the circuit board.

Figure 4A:
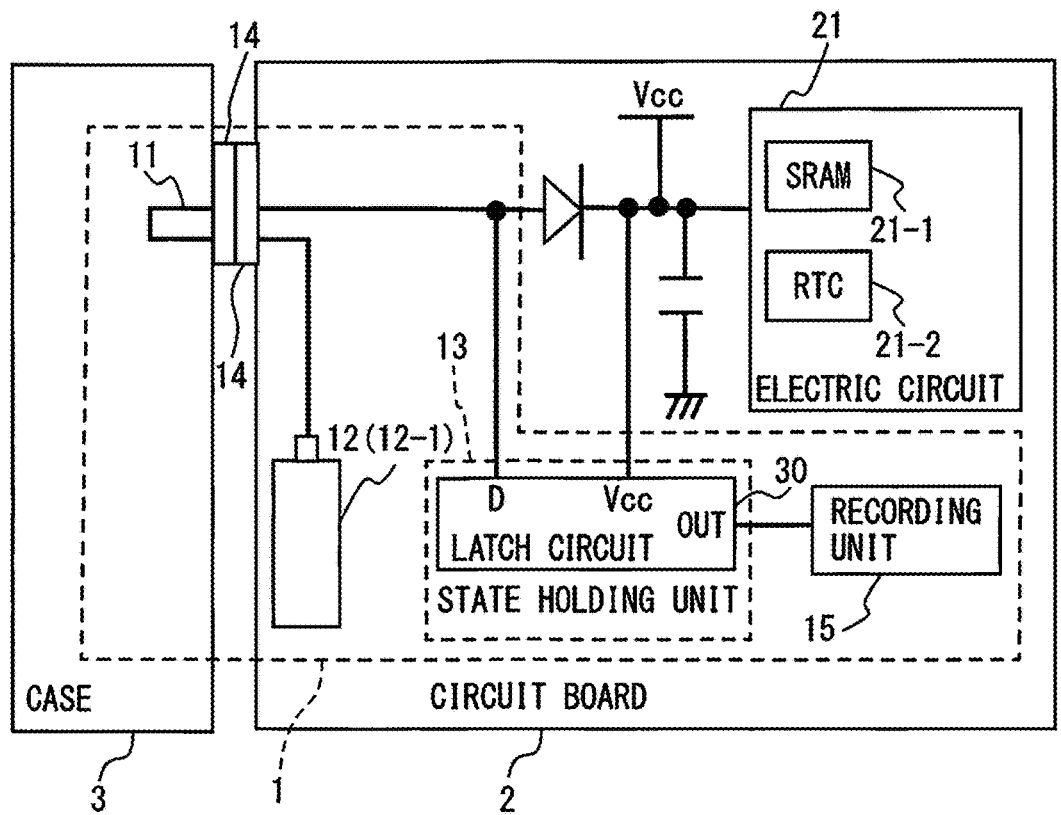
FIG. 4A is a schematic diagram illustrating a configuration of a case opening recording apparatus according to a second embodiment of the present disclosure, and illustrates a case where a case is attached to a circuit board.
Figure 4B:
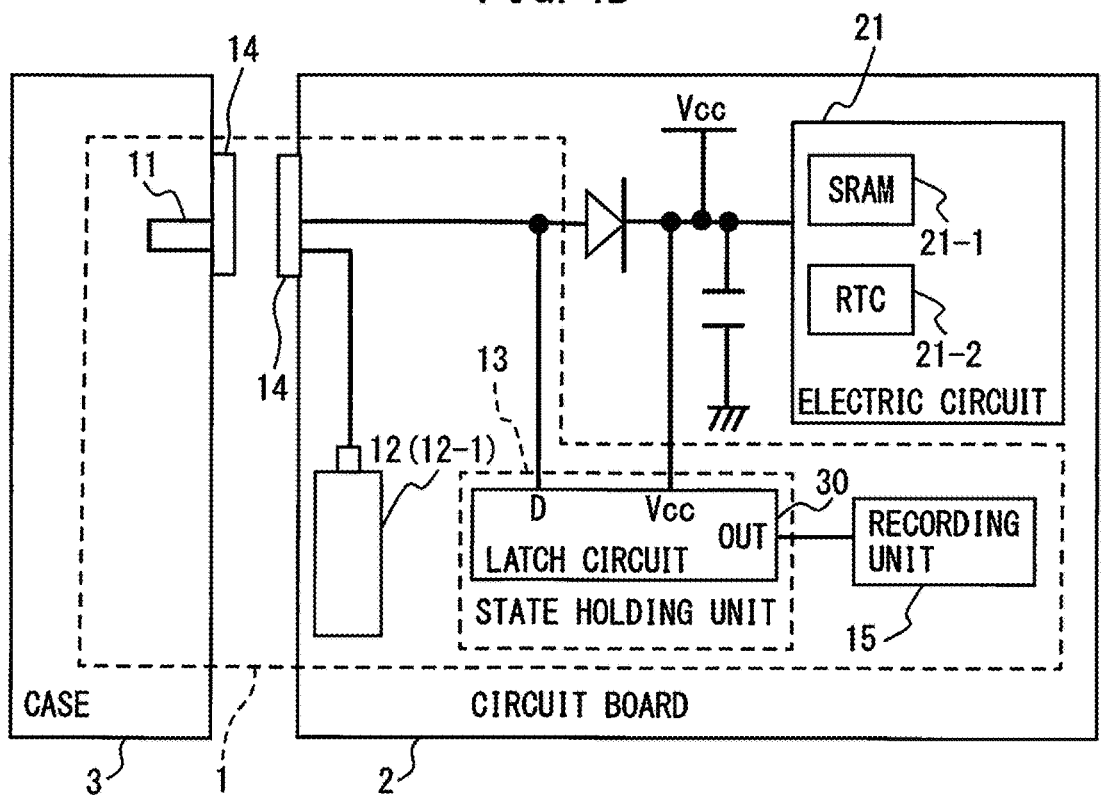
FIG. 4B is a schematic diagram illustrating the configuration of the case opening recording apparatus according to the second embodiment of the present disclosure, and illustrates a case where the case is removed from the circuit board.

FIG. 4A is a schematic diagram illustrating a configuration of a case opening recording apparatus according to the second embodiment of the present disclosure, and illustrates a case where a case is attached to a circuit board. FIG. 4B is a schematic diagram illustrating the configuration of the case opening recording apparatus according to the second embodiment of the present disclosure, and illustrates a case where the case is removed from the circuit board.

As illustrated in FIGS. 4A and 4B, a case opening recording apparatus 1 according to the second embodiment includes a current path 11 provided in a case 3, a battery 12-1 which is an auxiliary power supply 12 provided on a circuit board 2, a state holding unit 13, a connection unit 14, and a recording unit 15.

The second embodiment is different from the first embodiment in that the battery 12-1 serving as a backup power supply of an electric circuit 21 provided on the circuit board 2 at off-time of a main drive power supply Vcc of the mechanical apparatus is provided on the circuit board 2. The reason that the battery 12-1 is provided, and an example of the electric circuit 21 to which backup power is supplied by the battery 12-1 are as described according to the first embodiment.

The state holding unit 13 is provided between the connection unit 14 and the electric circuit 21 on the circuit board 2. An operation of the state holding unit 13 configured by a latch circuit 30 is as described according to the first embodiment.

Figure 5:
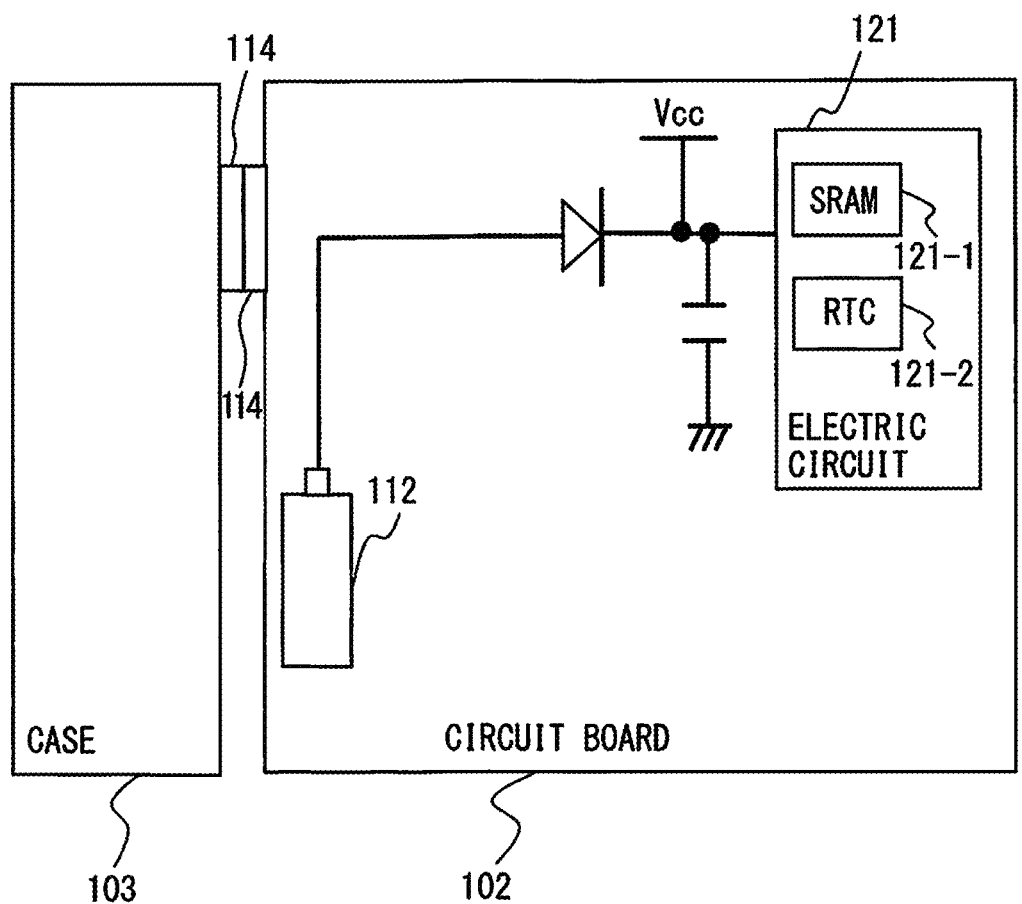
FIG. 5 is a schematic diagram illustrating a mechanical apparatus according to a conventional example in which a battery serving as a backup power supply is provided on a circuit board side.

When the circuit board 2 is housed in the case 3, the battery 12-1 is electrically connected to the latch circuit 30 and the electric circuit 21 via the current path 11, and when the circuit board 2 is not housed in the case 3, the battery 12-1 is electrically disconnected from the latch circuit 30 and the electric circuit 21. Here, a conventional example for comparison is described with reference to FIG. 5. FIG. 5 is a schematic diagram illustrating a mechanical apparatus according to a conventional example in which a battery serving as a backup power supply is provided on a circuit board side. As illustrated in FIG. 5, in the conventional example, power output from the battery 112 provided on the circuit board 102 is directly input to an electric circuit 121 including an SRAM 121-1 and a real-time clock (RTC) 121-2, regardless of whether or not a case 103 is removed. In contrast, according to the second embodiment, while the circuit board 2 is housed in the case 3, power output from the battery 12-1 is input to the electric circuit 21 including an SRAM 21-1 and a real-time clock 21-2, through the connection unit 14 provided on the circuit board 2, the current path 11 provided in the case 3, the connection unit 14 provided in the case 3, and the connection unit 14 provided on the circuit board 2. In other words, according to the second embodiment, power of the battery 12-1 is not input to the electric circuit 21 unless let through the current path 11 provided in the case 3. In order to bring power of the battery 12-1 through the current path 11 provided in the case 3 when the circuit board 2 is housed in the case 3 in this way, the connection unit 14 has a positive electrode connector terminal which passes current from the battery 12-1 to the current path 11, a positive electrode connector terminal which passes current from the current path 11 to the electric circuit 21, and a common negative electrode connector terminal (ground terminal).

While the circuit board 2 is housed in the case 3 as illustrated in FIG. 4A, the battery 12-1 is electrically connected to the latch circuit 30 and the electric circuit 21 via the current path 11 and the connection unit 14, and therefore, the latch circuit 30 and the electric circuit 21 receive supply of power from the battery 12-1 even at off-time of the main drive power supply Vcc of the mechanical apparatus. Thus, while the circuit board 2 is housed in the case 3 as illustrated in FIG. 4A, the latch circuit 30 holds a first state signal relevant to "HIGH" being voltage applied to a D input terminal (i.e., voltage between the connection unit 14 and the electric circuit 21).

When the case 3 is removed from the circuit board 2 as illustrated in FIG. 4B, the battery 12-1 is electrically disconnected from the electric circuit 21 and the latch circuit 30, voltage applied to the D input terminal of the latch circuit 30 (i.e., voltage between the connection unit 14 and the electric circuit 21) changes from "HIGH" to "LOW", and therefore, the latch circuit 30 holds (latches) a second state signal different from the first state signal held when the battery 12-1 and the latch circuit 30 are electrically connected to each other by the connection unit 14 via the current path 11 (i.e., when the circuit board 2 is housed in the case 3).

In this way, according to the second embodiment similarly to the first embodiment, the latch circuit 30 holds the first state signal while the circuit board 2 is housed in the case 3 as illustrated in FIG. 4A (i.e., while the case 3 has never been removed from the circuit board 2), and the latch circuit 30 holds the second state signal when the case 3 is removed from the circuit board 2 even once as illustrated in FIG. 4B. When the main drive power supply Vcc of the mechanical apparatus is switched from off to on, the recording unit 15 records a state signal held by the latch circuit 30 being the state holding unit 13, and therefore, according to the second embodiment similarly to the first embodiment, whether or not the case 3 is removed from the circuit board 2 can be determined by determining whether a state signal recorded in the recording unit 15 is the first state signal or the second state signal. The configuration and operation of the recording unit 15, and an example pertaining to reading of a state signal stored in the recording unit 15 are as described according to the first embodiment.

In a mechanical apparatus according to a conventional example as illustrated in FIG. 5 in which the battery 112 is provided on the circuit board 102 side, a configuration which records whether or not the case 103 is removed from the circuit board 102 is not provided, no change appears in the exterior of the mechanical apparatus before and after the removal of the case 103, and therefore, it is not possible to check whether or not the case 103 is removed from the circuit board 102. In contrast, the case opening recording apparatus 1 according to the second embodiment can record whether or not the case 3 is removed from the circuit board 2.

Next, a case opening recording apparatus according to a third embodiment is described.

According to the third embodiment, as an auxiliary power supply different from a main drive power supply of a mechanical apparatus, a battery serving as a backup power supply of an electric circuit provided on a circuit board at off-time of the main drive power supply is provided on the circuit board. The third embodiment is a further development of the second embodiment, records whether or not a case is removed from a circuit board, and supplies backup power to the electric circuit at off-time of the main drive power supply of the mechanical apparatus even while the case is removed from the circuit board.

Figure 6A:
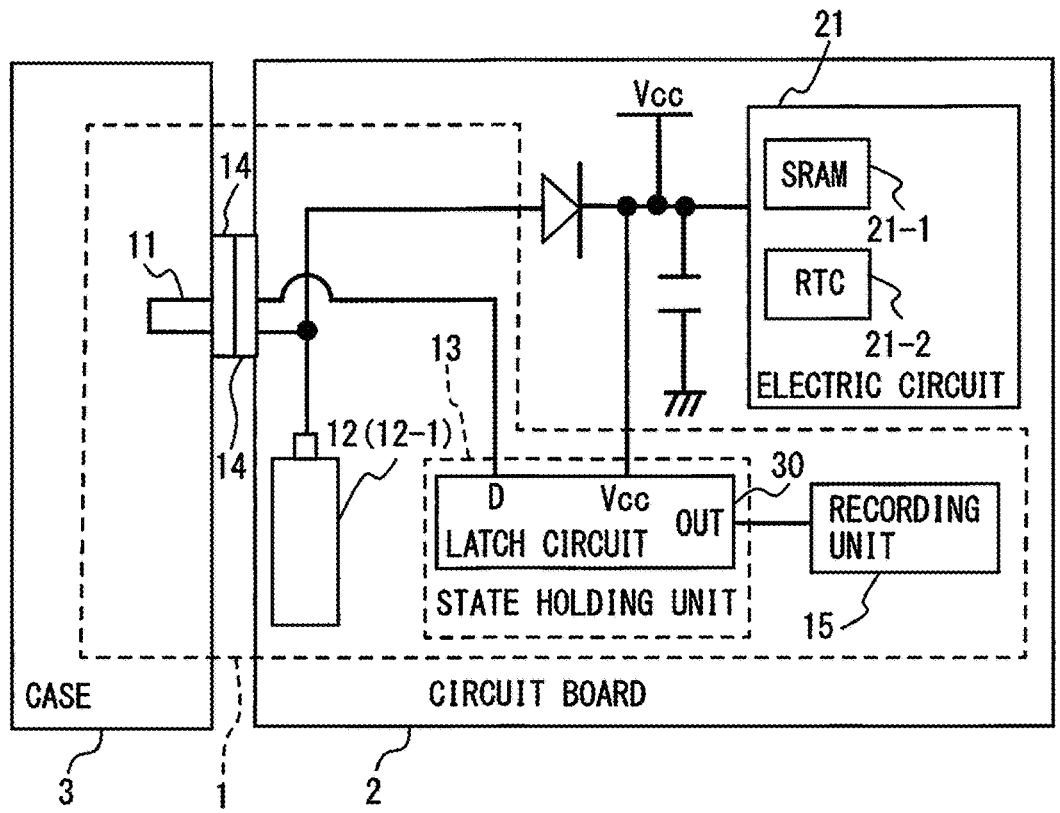
FIG. 6A is a schematic diagram illustrating a configuration of a case opening recording apparatus according to a third embodiment of the present disclosure, and illustrates a case where a case is attached to a circuit board.
Figure 6B:
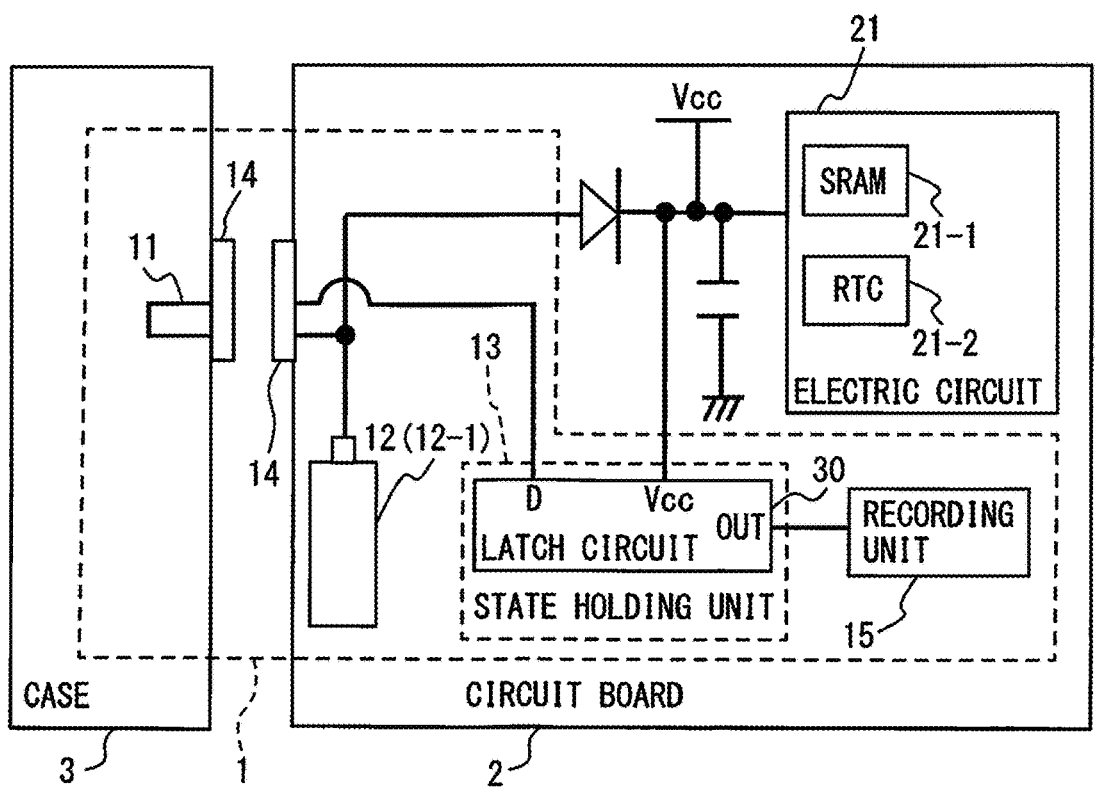
FIG. 6B is a schematic diagram illustrating the configuration of the case opening recording apparatus according to the third embodiment of the present disclosure, and illustrates a case where the case is removed from the circuit board.

FIG. 6A is a schematic diagram illustrating a configuration of the case opening recording apparatus according to the third embodiment of the present disclosure, and illustrates a case where a case is attached to a circuit board. FIG. 6B is a schematic diagram illustrating the configuration of the case opening recording apparatus according to the third embodiment of the present disclosure, and illustrates a case where the case is removed from the circuit board.

As illustrated in FIGS. 6A and 6B, a case opening recording apparatus 1 according to the third embodiment includes a current path 11 provided in a case 3, a battery 12-1 which is an auxiliary power supply 12 provided on a circuit board 2, a state holding unit 13, a connection unit 14, and a recording unit 15.

The reason that the battery 12-1 is provided and an example of the electric circuit 21 to which backup power is supplied by the battery 12-1 are as described according to the first embodiment.

The state holding unit 13 is provided between the connection unit 14 and the electric circuit 21 on the circuit board 2. An operation of the state holding unit 13 configured by a latch circuit 30 is as described according to the first embodiment. However, a wire through the connection unit 14 provided on the circuit board 2, the current path 11 provided in the case 3, the connection unit 14 provided in the case 3, and the connection unit 14 provided on the circuit board 2 is connected to a D input terminal of the latch circuit 30 in such a way that voltage output from the battery 12-1 is applied to the D input terminal.

The connection unit 14 electrically connects the battery 12-1 to the latch circuit 30 via the current path 11 when the circuit board 2 is housed in the case 3, and electrically disconnects the battery 12-1 from the latch circuit 30 when the circuit board 2 is not housed in the case 3. On the other hand, power output from the battery 12-1 provided on the circuit board 2 is directly input to an electric circuit 21 including an SRAM 21-1 and a real-time clock (RTC) 21-2, regardless of whether or not the case 3 is removed, in such a way that backup power is supplied to the electric circuit 21 at off-time of the main drive power supply Vcc of the mechanical apparatus even while the case 3 is removed from the circuit board 2.

Regarding the third embodiment, the configuration, operation, and the like of each element other than the above-described elements are similar to those according to the second embodiment, and therefore, description thereof is omitted.

Figure 7:
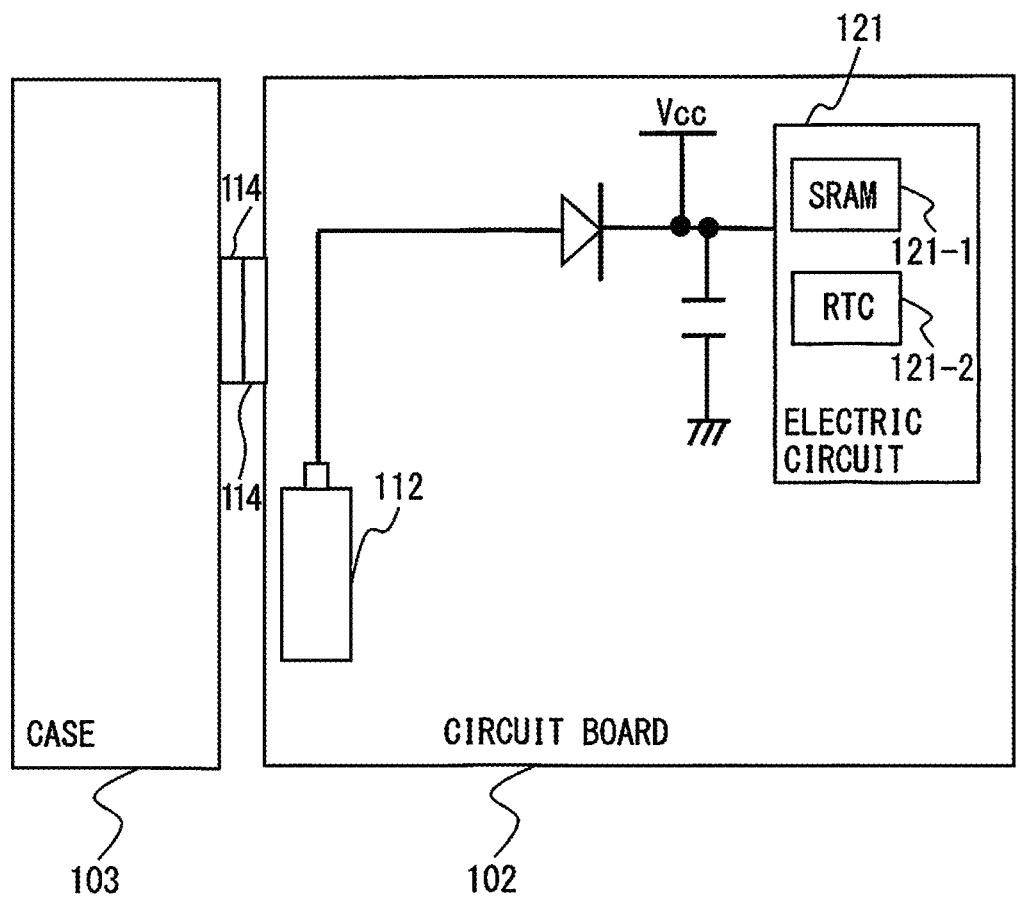
FIG. 7 is a schematic diagram illustrating a mechanical apparatus according to a conventional example in which a battery serving as a backup power supply is provided on a circuit board side.

FIG. 7 is a schematic diagram illustrating a mechanical apparatus according to a conventional example in which a battery serving as a backup power supply is provided on a circuit board side. In the mechanical apparatus according to the conventional example as illustrated in FIG. 7 in which the battery 112 is provided on the circuit board 102 side, a configuration which records whether or not the case 103 is removed from the circuit board 102 is not provided, no change appears in the exterior of the mechanical apparatus before and after the removal of the case 103, and therefore, it is not possible to check whether or not the case 103 is removed from the circuit board 102. In contrast, the case opening recording apparatus 1 according to the third embodiment can record whether or not the case 3 is removed from the circuit board 2, and supplies backup power to the electric circuit 21 at off-time of the main drive power supply Vcc of the mechanical apparatus even while the case 3 is removed from the circuit board 2. Next, a case opening recording apparatus according to a fourth embodiment is described.

According to the fourth embodiment, in a mechanical apparatus in which a battery serving as a backup power supply of an electric circuit provided on a circuit board at off-time of a main drive power supply of the mechanical apparatus is provided neither on a circuit board 2 nor in a case 3, whether or not the case 3 is removed from the circuit board 2 is recorded.

Figure 8A:
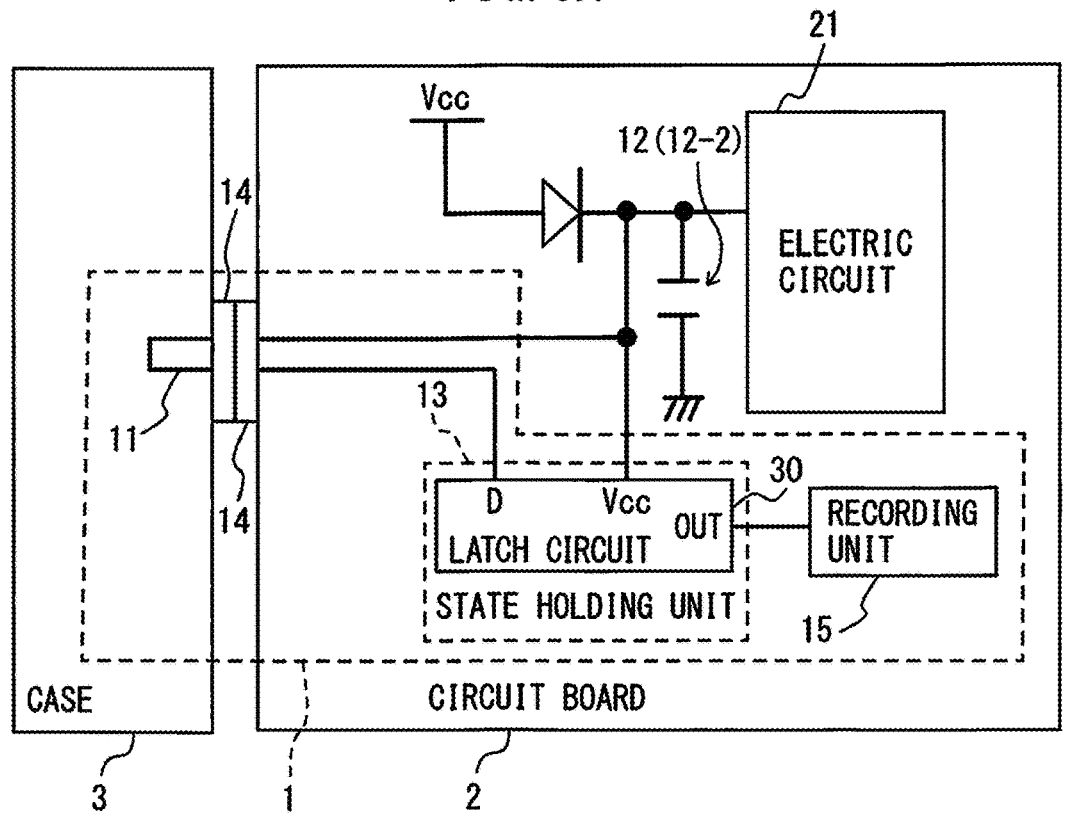
FIG. 8A is a schematic diagram illustrating a configuration of a case opening recording apparatus according to a fourth embodiment of the present disclosure, and illustrates a case where a case is attached to a circuit board.
Figure 8B:
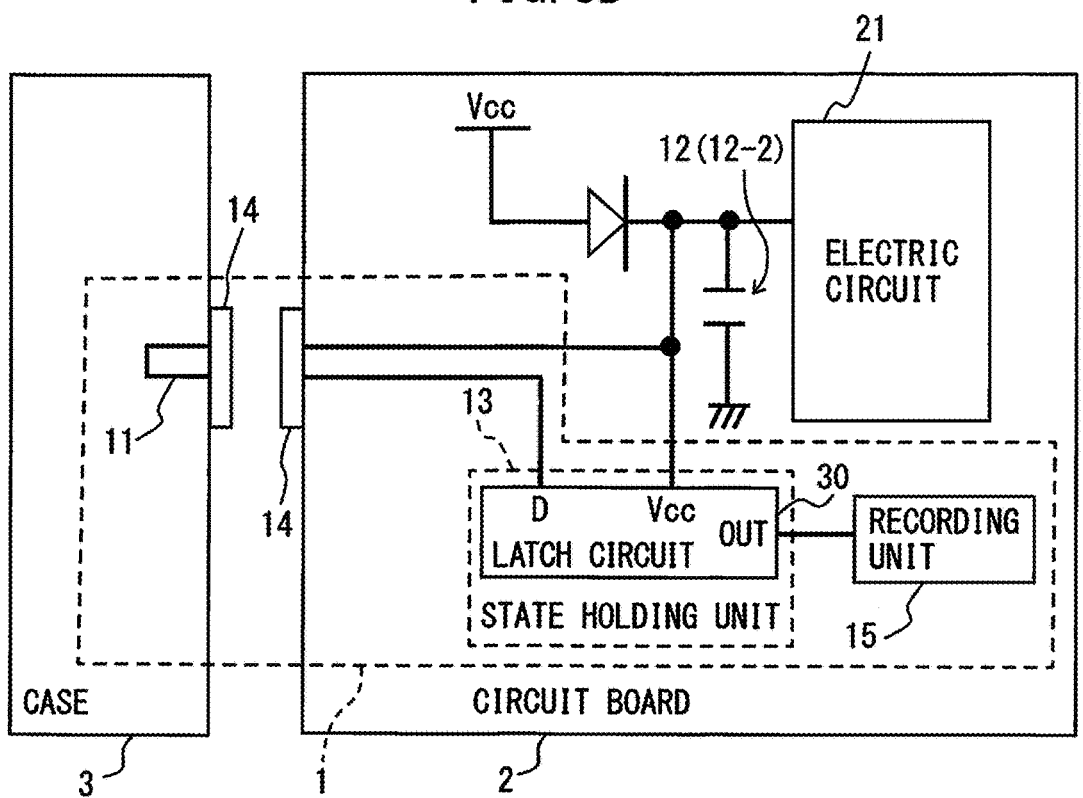
FIG. 8B is a schematic diagram illustrating the configuration of the case opening recording apparatus according to the fourth embodiment of the present disclosure, and illustrates a case where the case is removed from the circuit board.

FIG. 8A is a schematic diagram illustrating a configuration of a case opening recording apparatus according to the fourth embodiment of the present disclosure, and illustrates a case where a case is attached to a circuit board. FIG. 8B is a schematic diagram illustrating the configuration of the case opening recording apparatus according to the fourth embodiment of the present disclosure, and illustrates a case where the case is removed from the circuit board.

As illustrated in FIGS. 8A and 8B, a case opening recording apparatus 1 according to the fourth embodiment includes a current path 11 provided in a case 3, a capacitor 12-2 which is an auxiliary power supply 12 provided on a circuit board 2, a state holding unit 13, a connection unit 14, and a recording unit 15.

Figure 9:
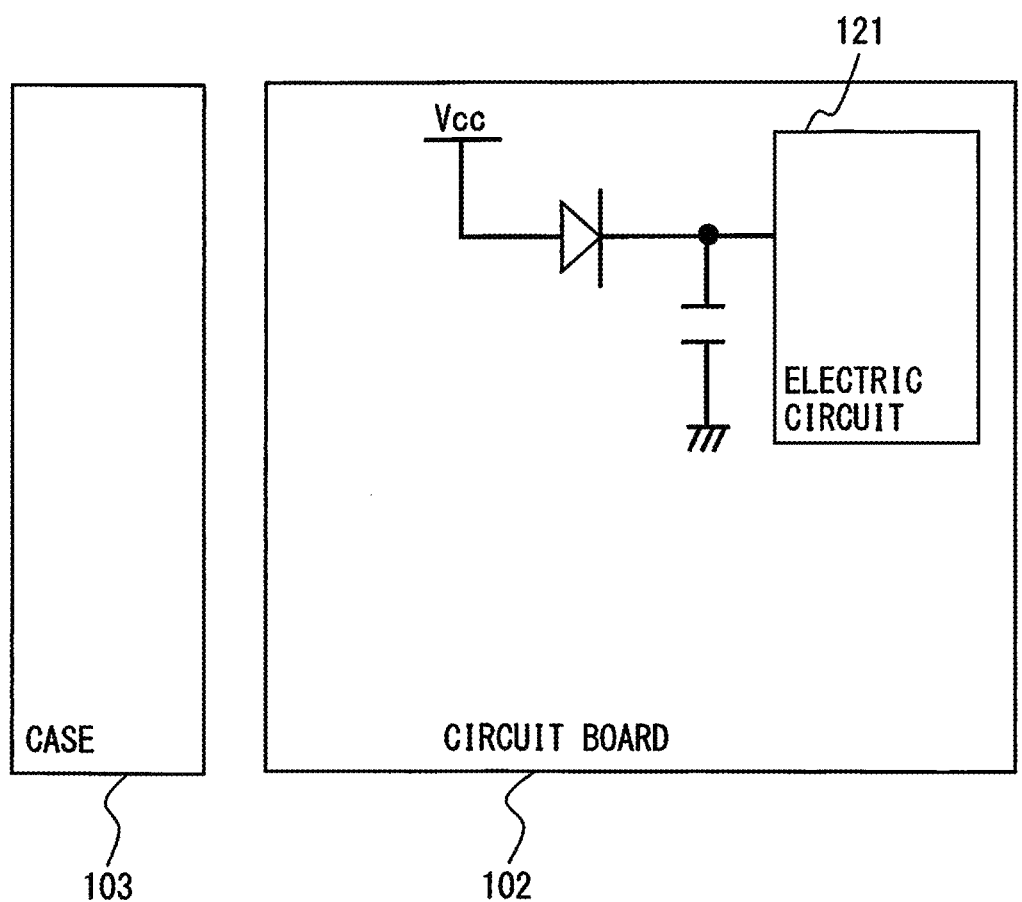
FIG. 9 is a schematic diagram illustrating a mechanical apparatus according to a conventional example in which no battery serving as a backup power supply is provided.

Here, a conventional example for comparison is described with reference to FIG. 9. FIG. 9 is a schematic diagram illustrating a mechanical apparatus according to the conventional example in which no battery serving as a backup power supply is provided. As illustrated in FIG. 9, conventionally, when an electric circuit 121 provided on a circuit board 102 does not include an electronic component which is required to receive supply of backup power at off-time of a main drive power supply of the mechanical apparatus, a battery for a backup power supply cannot be provided. According to the fourth embodiment, in a mechanical apparatus in which a battery for a backup power supply cannot be provided, the capacitor 12-2 having a relatively great capacity is provided, and whether or not the case 3 is removed from the circuit board 2 is recorded by operating a latch circuit 30 which configures the state holding unit 13 by use of power stored in the capacitor 12-2.

As described above, while a diode and a capacitor are provided at an input stage of the electric circuit 21 in preparation for off-time of the main drive power supply Vcc of the mechanical apparatus, this capacitor is also used as the auxiliary power supply 12 according to the fourth embodiment. The capacitor 12-2 as the auxiliary power supply 12 is charged by the main drive power supply Vcc at on-time of the main drive power supply Vcc of the mechanical apparatus. Note that, at off-time of the main drive power supply Vcc of the mechanical apparatus, the capacitor 12-2 is gradually discharged regardless of whether or not the case 3 is removed, and therefore, the capacity of the capacitor 12-2 is preferably greater in order to ensure the operation of the latch circuit 30 at off-time of the main drive power supply Vcc of the mechanical apparatus. When a period of off-time of the main drive power supply Vcc of the mechanical apparatus extends, for example, approximately several days, several weeks, several months, or several years, the capacity of the capacitor 12-2 may be determined depending on the length of an assumed period of off-time of the main drive power supply Vcc.

The state holding unit 13 is provided between the connection unit 14 and the electric circuit 21 on the circuit board 2. An operation of the state holding unit 13 configured by the latch circuit 30 is as described according to the first embodiment. However, a wire through the capacitor 12-2, the connection unit 14 provided on the circuit board 2, the current path 11 provided in the case 3, the connection unit 14 provided in the case 3, and the connection unit 14 provided on the circuit board 2 is connected to a D input terminal of the latch circuit 30 in such a way that voltage output from the capacitor 12-2 is applied to the D input terminal. Moreover, at on-time of the main drive power supply Vcc of the mechanical apparatus, power of this main drive power supply Vcc is supplied to a Vcc terminal (power input terminal) of the latch circuit 30, and at on-time of the main drive power supply Vcc of the mechanical apparatus, power stored in the capacitor 12-2 is supplied. Consequently, the latch circuit 30 can operate regardless of on or off of the main drive power supply Vcc of the mechanical apparatus.

The connection unit 14 electrically connects the capacitor 12-2 to the D input terminal of the latch circuit 30 via the current path 11 when the circuit board 2 is housed in the case 3, and electrically disconnects the capacitor 12-2 from the D input terminal of the latch circuit 30 when the circuit board 2 is not housed in the case 3. In other words, according to the fourth embodiment, power of the capacitor 12-2 at off-time of the main drive power supply Vcc of the mechanical apparatus is not input to the D input terminal of the latch circuit 30 unless let through the current path 11 provided in the case 3. In order to bring power of the capacitor 12-2 through the current path 11 provided in the case 3 when the circuit board 2 is housed in the case 3 in this way, the connection unit 14 has a positive electrode connector terminal which passes current from the capacitor 12-2 to the current path 11, a positive electrode connector terminal which passes current from the current path 11 to the D input terminal of the latch circuit 30, and a common negative electrode connector terminal (ground terminal).

While the circuit board 2 is housed in the case 3 as illustrated in FIG. 8A, the capacitor 12-2 is electrically connected to the D input terminal of the latch circuit 30 via the current path 11 and the connection unit 14, and therefore, the latch circuit 30 receives supply of power from the capacitor 12-2 even at off-time of the main drive power supply Vcc of the mechanical apparatus. Thus, while the circuit board 2 is housed in the case 3 as illustrated in FIG. 8A, the latch circuit 30 holds a first state signal relevant to "HIGH" being voltage applied to the D input terminal (i.e., positive potential of the capacitor 12-2).

When the case 3 is removed from the circuit board 2 as illustrated in FIG. 8B, the capacitor 12-2 is electrically disconnected from the D input terminal of the latch circuit 30, voltage applied to the D input terminal of the latch circuit 30 (i.e., positive potential of the capacitor 12-2) changes from "HIGH" to "LOW", and therefore, the latch circuit 30 holds (latches) a second state signal different from the first state signal held when the capacitor 12-2 and the latch circuit 30 are electrically connected to each other by the connection unit 14 via the current path 11 (i.e., when the circuit board 2 is housed in the case 3).

In this way, according to the fourth embodiment similarly to the first embodiment, the latch circuit 30 holds the first state signal while the circuit board 2 is housed in the case 3 as illustrated in FIG. 8A (i.e., while the case 3 has never been removed from the circuit board 2), and the latch circuit 30 holds the second state signal when the case 3 is removed from the circuit board 2 even once as illustrated in FIG. 8B. When the main drive power supply Vcc of the mechanical apparatus is switched from off to on, the recording unit 15 records a state signal held by the latch circuit 30 being the state holding unit 13, and therefore, according to the fourth embodiment similarly to the first embodiment, whether or not the case 3 is removed from the circuit board 2 can be determined by determining whether a state signal recorded in the recording unit 15 is the first state signal or the second state signal. The configuration and operation of the recording unit 15, and the example pertaining to reading of a state signal stored in the recording unit 15 are as described according to the first embodiment.

In a mechanical apparatus according to a conventional example as illustrated in FIG. 9 in which a battery serving as a backup power supply can be provided neither on the circuit board 102 nor in a case 103, a configuration which records whether or not the case 103 is removed from the circuit board 102 is not provided, no change appears in the exterior of the mechanical apparatus before and after the removal of the case 103, and therefore, it is not possible to check whether or not the case 103 is removed from the circuit board 102. In contrast, the case opening recording apparatus 1 according to the fourth embodiment can record whether or not the case 3 is removed from the circuit board 2.

Next, a case opening recording apparatus according to a fifth embodiment is described.

In the fifth embodiment, as an auxiliary power supply different from a main drive power supply of a mechanical apparatus, a battery serving as a backup power supply of an electric circuit provided on a circuit board at off-time of the main drive power supply is provided in a case. The fifth embodiment is a further development of the first embodiment, and enables recording of whether or not a case is removed from a circuit board and recording of whether or not a battery is removed from a case to be separately performed.

Figure 10A:
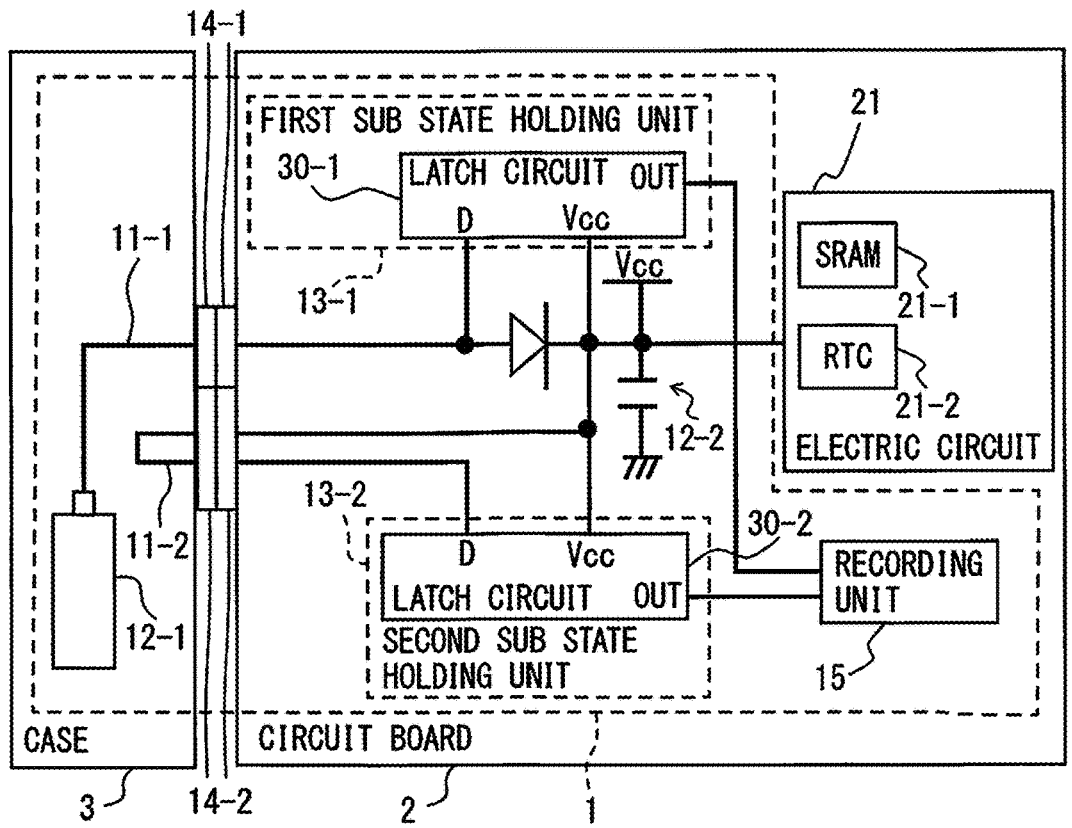
FIG. 10A is a schematic diagram illustrating a configuration of a case opening recording apparatus according to a fifth embodiment of the present disclosure, and illustrates a case where a case is attached to a circuit board.
Figure 10B:
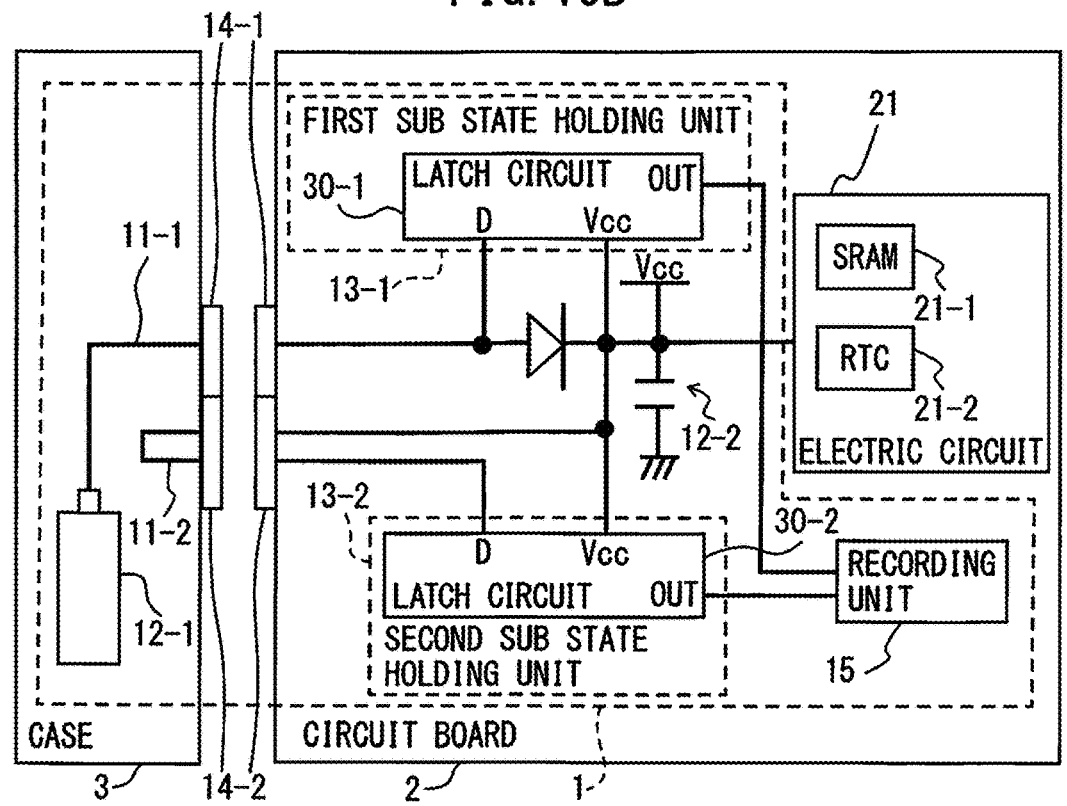
FIG. 10B is a schematic diagram illustrating the configuration of the case opening recording apparatus according to the fifth embodiment of the present disclosure, and illustrates a case where the case is removed from the circuit board.

FIG. 10A is a schematic diagram illustrating a configuration of the case opening recording apparatus according to the fifth embodiment of the present disclosure, and illustrates a case where a case is attached to a circuit board. FIG. 10B is a schematic diagram illustrating the configuration of the case opening recording apparatus according to the fifth embodiment of the present disclosure, and illustrates a case where the case is removed from the circuit board.

As illustrated in FIGS. 10A and 10B, a case opening recording apparatus 1 according to the fifth embodiment includes a first sub current path 11-1 and a second sub current path 11-2 provided in a case 3, a battery 12-1 provided on a circuit board 2, a capacitor 12-2 provided on the circuit board 2, a first sub state holding unit 13-1 and a second sub state holding unit 13-2, a first sub connection unit 14-1 and a second sub connection unit 14-2, and a recording unit 15.

The first sub current path 11-1 and the second sub current path 11-2 are provided independent of each other on the case 3. As will be described later, the first sub current path 11-1 is provided in order to supply power of the battery 12-1 to an electric circuit 21 including an SRAM 21-1 and a real-time clock 21-2 at off-time of a main drive power supply Vcc of a mechanical apparatus when the circuit board 2 is housed in the case 3. The second sub current path 11-2 is provided in order to operate a latch circuit 30 at off-time of the main drive power supply Vcc of the mechanical apparatus when the circuit board 2 is housed in the case 3.

The battery 12-1 is removably provided in the case 3. The battery 12-1 supplies power to the electric circuit 21 including the SRAM 21-1 and the real-time clock 21-2 at off-time of the main drive power supply Vcc of the mechanical apparatus when the circuit board 2 is housed in the case 3.

The capacitor 12-2 is provided on the circuit board 2, and is charged by the main drive power supply Vcc at on-time of the main drive power supply Vcc of the mechanical apparatus. Note that, at off-time of the main drive power supply Vcc of the mechanical apparatus, the capacitor 12-2 is gradually discharged regardless of whether or not the case 3 is removed, and therefore, the capacity of the capacitor 12-2 is preferably greater in order to ensure the operation of the latch circuit 30 at off-time of the main drive power supply Vcc of the mechanical apparatus. A way of determining the capacity of the capacitor 12-2 is similar to that according to the fourth embodiment. Note that the capacitor 12-2 may double as a capacitor provided at an input stage of the electric circuit 21 together with a diode in preparation for off-time of the main drive power supply Vcc of the mechanical apparatus.

The first sub state holding unit 13-1 is provided between the first sub connection unit 14-1 and the electric circuit 21 on the circuit board 2. An operation of the first sub state holding unit 13-1 configured by a latch circuit 30-1 is as described in connection with the operation of the state holding unit 13 configured by the latch circuit 30 according to the first embodiment. However, a wire through the battery 12-1, the first sub current path 11-1 provided in the case 3, the first sub connection unit 14-1 provided in the case 3, and the first sub connection unit 14-1 provided on the circuit board 2 is connected to a D input terminal of the latch circuit 30-1 in such a way that voltage output from the battery 12-1 is applied to the D input terminal while the circuit board 2 is housed in the case 3. At on-time of the main drive power supply Vcc of the mechanical apparatus, power of this main drive power supply Vcc is supplied to a Vcc terminal (power input terminal) of the latch circuit 30-1, and at on-time of the main drive power supply Vcc of the mechanical apparatus, power output from the battery 12-1 is supplied while the circuit board 2 is housed in the case 3.

The second sub state holding unit 13-2 is provided between the second sub connection unit 14-2 and the electric circuit 21 on the circuit board 2. An operation of the second sub state holding unit 13-2 configured by a latch circuit 30-2 is as described according to the fourth embodiment. However, a wire through the capacitor 12-2, the second sub connection unit 14-2 provided on the circuit board 2, the second sub current path 11-2 provided in the case 3, the second sub connection unit 14-2 provided in the case 3, and the second sub connection unit 14-2 provided on the circuit board 2 is connected to a D input terminal of the latch circuit 30-2 in such a way that voltage output from the capacitor 12-2 is applied to the D input terminal. Moreover, at on-time of the main drive power supply Vcc of the mechanical apparatus, power of this main drive power supply Vcc is supplied to a Vcc terminal (power input terminal) of the latch circuit 30-2, and at on-time of the main drive power supply Vcc of the mechanical apparatus, power stored in the capacitor 12-2 is supplied. Consequently, the latch circuit 30-2 can operate regardless of on or off of the main drive power supply Vcc of the mechanical apparatus.

As illustrated in FIG. 10A, the first sub connection unit 14-1 electrically connects the battery 12-1 to the first sub state holding unit 13-1 and the electric circuit 21 via the first sub current path 11-1 when the circuit board 2 is housed in the case 3 and the battery 12-1 is attached to the case 3. Moreover, as illustrated in FIG. 10B, the first sub connection unit 14-1 electrically disconnects the battery 12-1 from the first sub state holding unit 13-1 and the electric circuit 21 when the circuit board 2 is not housed in the case 3. The first sub connection unit 14-1 is configured by a positive electrode connector terminal and a negative electrode connector terminal (ground terminal) with which the battery 12-1 provided in the case 3 is electrically connected to the electric circuit 21 provided on the circuit board 2 as well as the first sub state holding unit 13-1 along with physical connection between the case 3 and the circuit board 2. Note that, when the circuit board 2 is housed in the case 3 but the battery 12-1 is removed from the case 3, no voltage is naturally applied to a D input terminal of the latch circuit 30-1 of the first sub state holding unit 13-1 and the electric circuit 21.

As illustrated in FIG. 10A, the second sub connection unit 14-2 electrically connects the capacitor 12-2 to a D input terminal of the latch circuit 30-2 via the second sub current path 11-2 when the circuit board 2 is housed in the case 3, and the second sub connection unit 14-2 electrically disconnects the capacitor 12-2 from the D input terminal of the latch circuit 30-2 when the circuit board 2 is not housed in the case 3. In other words, according to the fifth embodiment, power of the capacitor 12-2 at off-time of the main drive power supply Vcc of the mechanical apparatus is not input to the D input terminal of the latch circuit 30-2 unless let through the second sub current path 11-2 provided in the case 3. In order to bring power of the capacitor 12-2 through the second sub current path 11-2 provided in the case 3 when the circuit board 2 is housed in the case 3 in this way, the second sub connection unit 14-2 has a positive electrode connector terminal which passes current from the capacitor 12-2 to the second sub current path 11-2, a positive electrode connector terminal which passes current from the second sub current path 11-2 to the D input terminal of the latch circuit 30-2, and a common negative electrode connector terminal (ground terminal).

While the circuit board 2 is housed in the case 3 and the battery 12-1 is attached to the case 3 as illustrated in FIG. 10A, the battery 12-1 is electrically connected to the latch circuit 30-1 of the first sub state holding unit 13-1 and the electric circuit 21 via the current path 11 and the connection unit 14, and therefore, the latch circuit 30-1 and the electric circuit 21 receive supply of power from the battery 12-1 even at off-time of the main drive power supply Vcc of the mechanical apparatus. Thus, while the circuit board 2 is housed in the case 3 and the battery 12-1 is attached to the case 3 as illustrated in FIG. 10A, the latch circuit 30-1 holds a first state signal relevant to "HIGH" being voltage applied to the D input terminal (i.e., voltage between the connection unit 14 and the electric circuit 21). Moreover, the capacitor 12-2 is electrically connected to the D input terminal of the latch circuit 30-2 of the second sub state holding unit 13-2 via the second sub current path 11-2 and the second sub connection unit 14-2, and therefore, the latch circuit 30-2 receives supply of power from the capacitor 12-2 even at off-time of the main drive power supply Vcc of the mechanical apparatus. Thus, while the circuit board 2 is housed in the case 3 and the battery 12-1 is attached to the case 3 as illustrated in FIG. 10A, the latch circuit 30-2 holds a first state signal relevant to "HIGH" being voltage applied to the D input terminal (i.e., positive potential of the capacitor 12-2).

When the case 3 is removed from the circuit board 2 as illustrated in FIG. 10B, the battery 12-1 is electrically disconnected from the electric circuit 21 and the latch circuit 30-1, voltage applied to the D input terminal of the latch circuit 30-1 (i.e., voltage between the connection unit 14 and the electric circuit 21) changes from "HIGH" to "LOW", and therefore, the latch circuit 30-1 of the first sub state holding unit 13-1 holds (latches) a second state signal different from the first state signal held when the battery 12-1 and the latch circuit 30-1 are electrically connected to each other by the first sub connection unit 14-1 via the first sub current path 11-1 (i.e., when the circuit board 2 is housed in the case 3). Moreover, the capacitor 12-2 is electrically disconnected from the D input terminal of the latch circuit 30-2 of the second sub state holding unit 13-2, voltage applied to the D input terminal of the latch circuit 30-2 (i.e., positive potential of the capacitor 12-2) changes from "HIGH" to "LOW", and therefore, the latch circuit 30-2 of the second sub state holding unit 13-2 holds (latches) a second state signal different from the first state signal held when the capacitor 12-2 and the latch circuit 30-2 are electrically connected to each other by the second sub connection unit 14-2 via the second sub current path 11-2 (i.e., when the circuit board 2 is housed in the case 3). When the circuit board 2 is housed in the case 3 but the battery 12-1 is removed from the case 3, no voltage is applied to the D input terminal of the latch circuit 30-1 of the first sub state holding unit 13-1 and the electric circuit 21. Since voltage applied to the D input terminal of the latch circuit 30-1 (i.e., voltage between the connection unit 14 and the electric circuit 21) changes from "HIGH" to "LOW", the latch circuit 30-1 of the first sub state holding unit 13-1 holds (latches) a second state signal different from the first state signal held when the battery 12-1 and the latch circuit 30-1 are electrically connected to each other by the first sub connection unit 14-1 via the first sub current path 11-1 (i.e., when the circuit board 2 is housed in the case 3). On the other hand, even when the circuit board 2 is housed in the case 3 but the battery 12-1 is removed from the case 3, voltage applied to the D input terminal of the latch circuit 30-2 of the second sub state holding unit 13-2 remains "HIGH", and therefore, the latch circuit 30-2 holds (latches) the first state signal.

In this way, according to the fifth embodiment, while the circuit board 2 is housed in the case 3 and the battery 12-1 is attached to the case 3, the latch circuit 30-1 of the first sub state holding unit 13-1 and the latch circuit 30-2 of the second sub state holding unit 13-2 both hold the first state signal. When the case 3 is removed from the circuit board 2 even once, the latch circuit 30-1 of the first sub state holding unit 13-1 and the latch circuit 30-2 of the second sub state holding unit 13-2 both hold the second state signal. When the circuit board 2 is housed in the case 3 but the battery 12-1 is removed from the case 3, the latch circuit 30-1 of the first sub state holding unit 13-1 holds the second state signal, and the latch circuit 30-2 of the second sub state holding unit 13-2 holds the first state signal. When the main drive power supply Vcc of the mechanical apparatus is switched from off to on, the recording unit 15 records a state signal held by the latch circuit 30-1 being the first sub state holding unit 13-1 and a state signal held by the latch circuit 30-2 being the second sub state holding unit 13-2. Whether or not the case 3 is removed from the circuit board 2 can be determined by determining whether a state signal recorded in the recording unit 15 is the first state signal or the second state signal with regard to the latch circuit 30-1 and the latch circuit 30-2. Moreover, when a state signal recorded in the recording unit 15 is the second state signal with regard to the latch circuit 30-1 and the first state signal with regard to the latch circuit 30-2, it is found that the circuit board 2 is housed in the case 3 but the battery 12-1 alone is removed from the case 3 in the case where the circuit board 2 is housed in the case 3 but the battery 12-1 is removed from the case 3. The configuration and operation of the recording unit 15, and an example pertaining to reading of a state signal stored in the recording unit 15 are as described according to the first embodiment.

Next, a case opening recording apparatus according to a sixth embodiment is described.

According to the sixth embodiment, elapsed time after a case is removed from a circuit board according to the first to fifth embodiments is recorded. Here, as one example, an example of recording elapsed time after a case is removed from a circuit board according to the first embodiment is described.

Figure 11:
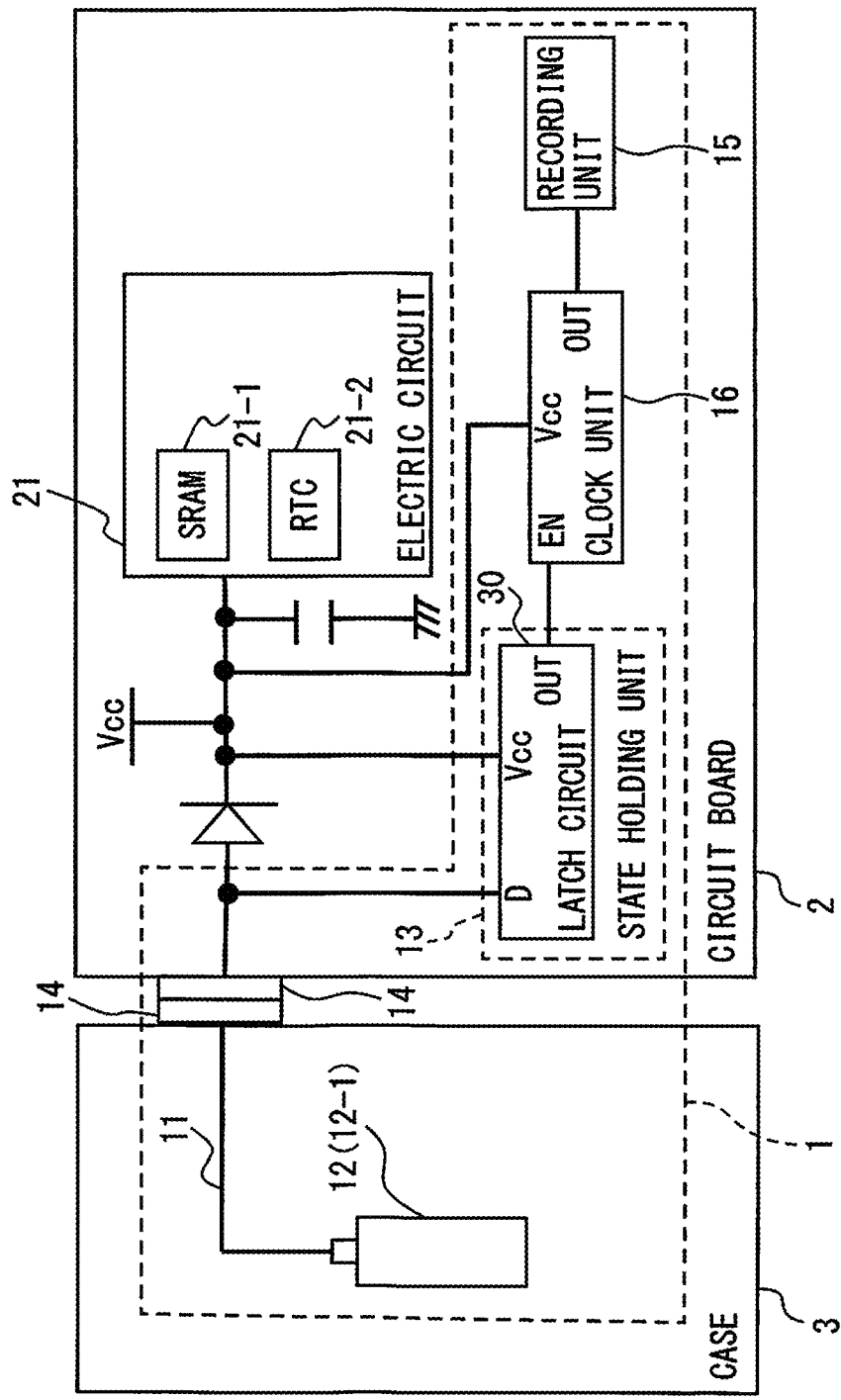
FIG. 11 is a schematic diagram illustrating a configuration of a case opening recording apparatus according to a sixth embodiment of the present disclosure.

FIG. 11 is a schematic diagram illustrating a configuration of the case opening recording apparatus according to the sixth embodiment of the present disclosure. As illustrated in FIG. 11, a clock unit 16 is connected to an output of the latch circuit 30 being the state holding unit 13 described with reference to FIGS. 1A and 1B. The clock unit 16 is configured by a real-time clock. An output terminal of the latch circuit 30 is connected to an enable (EN) terminal of the real-time clock as the clock unit 16. At on-time of the main drive power supply Vcc of the mechanical apparatus, power of this main drive power supply Vcc is supplied to a Vcc terminal (power input terminal) of the real-time clock as the clock unit 16. The real-time clock as the clock unit 16 and the real-time clock 21-2 included in the electric circuit 21 are set to the same time as an initial state. Unless the case 3 is removed from the circuit board 2, drive power is supplied to the real-time clock as the clock unit 16 and the real-time clock 21-2 included in the electric circuit 21 at on-time of the main drive power supply Vcc of the mechanical apparatus, and therefore, both the clocks are advanced at the same pace. Likewise, unless the case 3 is removed from the circuit board 2, drive power is not supplied to the real-time clock as the clock unit 16 and the real-time clock 21-2 included in the electric circuit 21 at off-time of the main drive power supply Vcc of the mechanical apparatus, and therefore, both the clocks are stopped at timing of off of the main drive power supply Vcc of the mechanical apparatus. Therefore, unless the case 3 is removed from the circuit board 2, the real-time clock as the clock unit 16 and the real-time clock 21-2 included in the electric circuit 21 both clock the same time. On the other hand, when the case 3 is removed from the circuit board 2, voltage applied to the D input terminal of the latch circuit 30 of the state holding unit 13 changes from "HIGH" to "LOW" as described with reference to FIGS. 1A and 1B, and therefore, the latch circuit 30 holds (latches) a second state signal different from the first state signal held when the battery 12-1 and the latch circuit 30 are electrically connected to each other by the connection unit 14 via the current path 11 (i.e., when the circuit board 2 is housed in the case 3). When a signal from the latch circuit 30 is asserted, the real-time clock as the clock unit 16 stops its clocking. Therefore, when there arises a difference between a clock value clocked by the real-time clock 21-2 included in the electric circuit 21 and a clock value clocked by the real-time clock as the clock unit 16, the difference of the clock values corresponds to an elapsed time after the case 3 is removed from the circuit board 2. An output of the real-time clock as the clock unit 16 is recorded in the recording unit 15 when the main drive power supply Vcc of the mechanical apparatus is switched from off to on. An elapsed time after the case 3 is removed from the circuit board 2 can be acquired by calculating, in, for example, an arithmetic processing apparatus (not illustrated) provided in the electric circuit 21, a difference between a clock value of the real-time clock as the clock unit 16 stored in the recording unit 15 and a clock value clocked by the real-time clock 21-2 included in the electric circuit 21.

Although an example of recording elapsed time after the case 3 is removed from the circuit board 2 according to the first embodiment is described with regard to the above sixth embodiment, elapsed time after the case 3 is removed from the circuit board 2 can also be recorded according to the second to fifth embodiments. Particularly according to the fifth embodiment, elapsed time after the battery 12-1 is removed from the case 3 can be recorded. In each case, the enable (EN) terminal of the real-time clock as the clock unit 16 may be connected to the output terminal of the latch circuit of the state holding unit in each of the second to fifth embodiments, and drive power may be appropriately supplied to the Vcc terminal (power input terminal) of the real-time clock as the clock unit 16.

The first to sixth embodiments described above may be suitably executed in combination.

Furthermore, the case opening recording apparatuses 1 according to the first to sixth embodiments described above may be provided in a plurality of mechanical apparatuses, and the plurality of case opening recording apparatuses 1 may be connected to a communication network in such a way that whether or not the case 3 is removed and whether or not the battery 12-1 is removed can be checked from an upper controller.

Figure 12:
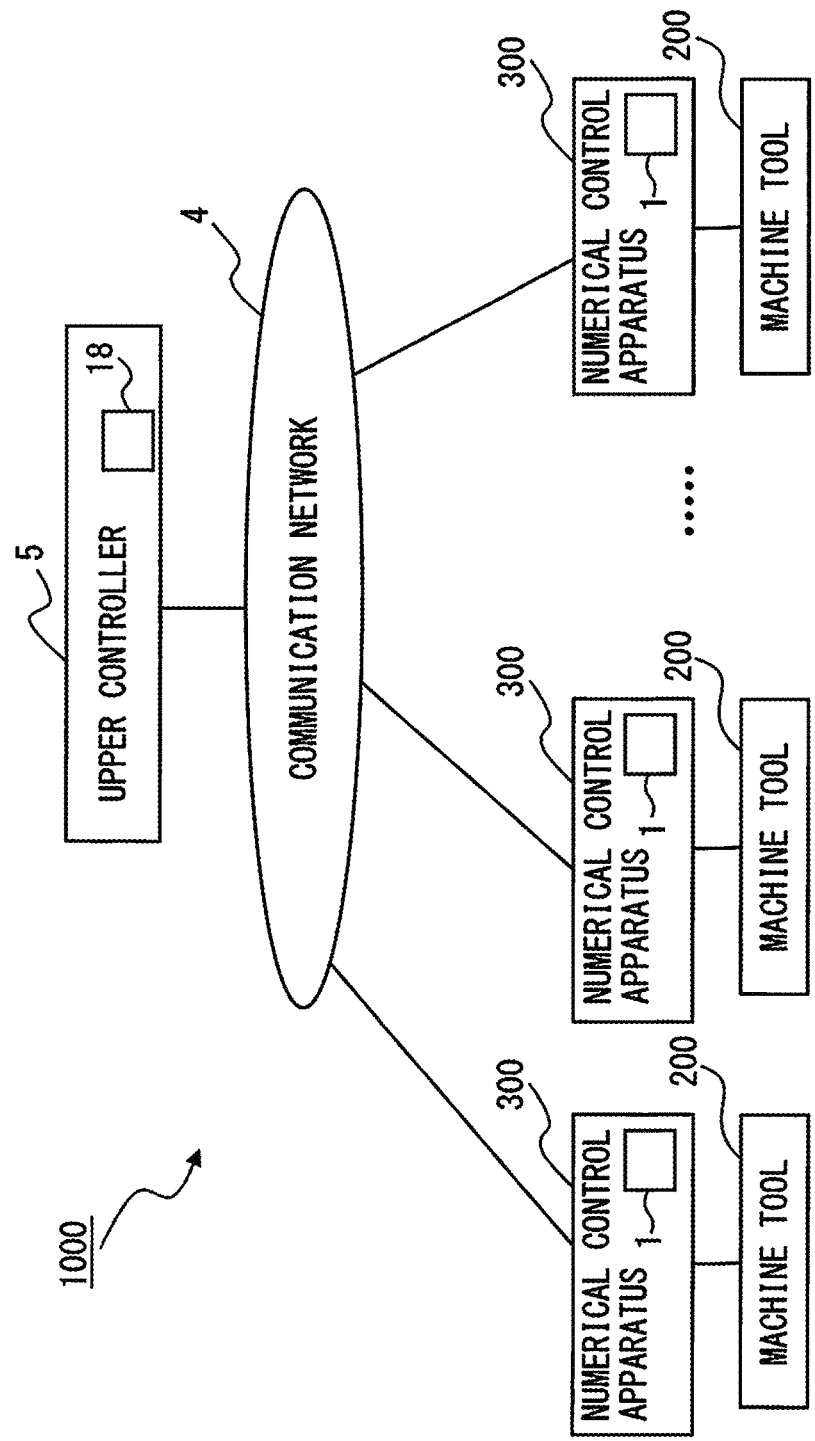
FIG. 12 is a schematic diagram illustrating a configuration of a case opening recording system according to one embodiment of the present disclosure.

FIG. 12 is a schematic diagram illustrating a configuration of a case opening recording system according to one embodiment of the present disclosure. Although a case where a mechanical apparatus is a numerical control apparatus 300 of a machine tool 200 is described here as one example, the present invention is also applicable even when a mechanical apparatus is an amplifier (servo amplifier) which drives a motor.

A case opening recording system 1000 includes a plurality of case opening recording apparatuses 1 according to any one of the first to sixth embodiments provided in relation to a plurality of numerical control apparatuses 300 of machine tools 200 being mechanical apparatuses, a communication network 4 which communicably connects each of the plurality of case opening recording apparatuses 1, and an upper controller 5 which is communicably connected to the communication network 4 and controls the operation of each of the plurality of numerical control apparatuses 300 of the machine tools 200.

The case opening recording apparatus 1 is provided in, for example, the numerical control apparatus 300. The recording unit 15 which records outputs of the latch circuits 30, 30-1, and 30-2 in the case opening recording apparatuses 1 described in connection with the first to sixth embodiments and an output of the real-time clock as the clock unit 16 is connected to the communication network 4 via a communication interface (not illustrated). The upper controller 5 reads information relating to a state signal and elapsed time recorded in the recording unit 15 in each of the case opening recording apparatuses 1 received via the communication network 4. The upper controller has an overall recording unit 18 which records the pieces of information recorded in the recording unit 15 in each of the case opening recording apparatuses 1. The overall recording unit 18 records information indicating that the case 3 is removed from the circuit board 2 in the numerical control apparatus 300 when, for example, the state holding unit of the case opening recording apparatus 1 relevant to each of the numerical control apparatuses 300 of the plurality of machine tools 200 holds a second state signal different from the first state signal held when the auxiliary power supply 12 and the state holding unit are electrically connected to each other by the connection unit via the current path (i.e., when the case 3 is attached to the circuit board 2).

The information recorded in the overall recording unit 18 can display, for example, "case of which numerical control apparatus is removed from circuit board" on a display (not illustrated) attached to the upper controller. Moreover, the case opening recording system 1000 including the case opening recording apparatus 1 according to the fifth embodiment can display "from case of which numerical control apparatus battery is removed". Further, the case opening recording system 1000 including the case opening recording apparatus 1 according to the sixth embodiment can display "case of which numerical control apparatus is removed from circuit board" and "elapsed time after case is removed from circuit board". Note that information recorded in the overall recording unit 18 may be saved as a log.

As described above, the case opening recording apparatuses 1 and the case opening recording system 1000 according to the first to sixth embodiments can record, as electronic data, whether or not the case 3 is removed from the circuit board 2, and therefore, can further take advantage of recorded electronic data. Note that, as a conventional example, in order to check whether or not a case is removed from a circuit board, the case and the circuit board may be sealed with a paper or vinyl seal. However, sealing with a seal is easily forged, does not enable opening to be checked by electronic data, and therefore lacks expansibility.

According to one aspect of the present disclosure, it is possible to achieve a case opening recording apparatus and a case opening recording system which, in a mechanical apparatus having a circuit board provided with an electric circuit, and a case capable of housing the circuit board, record whether or not a case is removed from a circuit board.

The invention claimed is:

1. A case opening recording apparatus which, in a mechanical apparatus having a circuit board provided with an electric circuit, and a case capable of housing the circuit board, records whether or not the case is removed from the circuit board, the case opening recording apparatus comprising:
a current path provided in the case;
an auxiliary power supply provided in either the circuit board or the case and different from a main drive power supply of the mechanical apparatus;
a state holding unit in which a state signal to be held is switched when received voltage changes; and
a connection unit configured to electrically connect the auxiliary power supply to the state holding unit via the current path when the circuit board is housed in the case, and electrically disconnect the auxiliary power supply from the state holding unit when the circuit board is not housed in the case, wherein
in a case where the state holding unit holds a state signal different from a state signal held when the auxiliary power supply and the state holding unit are electrically connected to each other by the connection unit via the current path, removal of the case from the circuit board is recorded,
wherein
the current path includes a first sub current path and a second sub current path independent of each other,
the state holding unit includes a first sub state holding unit and a second sub state holding unit, and
the connection unit includes:
a first sub connection unit configured to electrically connect or disconnect the auxiliary power supply to or from the first sub state holding unit via the first sub current path, for switching the state signal held in the state holding unit, and
a second sub connection unit configured to electrically connect or disconnect the auxiliary power supply to or from the second sub state holding unit via the second sub current path, for switching the state signal held in the state holding unit.

2. The case opening recording apparatus according to claim 1, further comprising a recording unit configured to record a state signal held by the state holding unit when the main drive power supply is switched from off to on.

3. The case opening recording apparatus according to claim 1, wherein the auxiliary power supply is a battery serving as a backup power supply of the electric circuit provided on the circuit board at off-time of the main drive power supply.

4. The case opening recording apparatus according to claim 3, wherein the electric circuit includes a storage device.

5. The case opening recording apparatus according to claim 3, wherein the electric circuit includes a real-time clock.

6. The case opening recording apparatus according to claim 1, wherein the auxiliary power supply is a capacitor provided on the circuit board, and
the capacitor is charged by the main drive power supply at on-time of the main drive power supply.

7. The case opening recording apparatus according to claim 1, further comprising a clock unit configured to clock time in which the state holding unit holds a state signal different from a state signal held when the auxiliary power supply and the state holding unit are electrically connected to each other by the connection unit via the current path.

8. The case opening recording apparatus according to claim 1, wherein the mechanical apparatus includes a numerical control apparatus of a machine tool.

9. The case opening recording apparatus according to claim 1, wherein the mechanical apparatus is an amplifier configured to supply drive power to a motor.

10. A case opening recording apparatus which, in a mechanical apparatus having a circuit board provided with an electric circuit, and a case capable of housing the circuit board, records whether or not the case is removed from the circuit board, the case opening recording apparatus comprising:
   a current path provided in the case;
   an auxiliary power supply provided in either the circuit board or the case and different from a main drive power supply of the mechanical apparatus;
   a state holding unit in which a state signal to be held is switched when received voltage changes; and
   a connection unit configured to electrically connect the auxiliary power supply to the state holding unit via the current path when the circuit board is housed in the case, and electrically disconnect the auxiliary power supply from the state holding unit when the circuit board is not housed in the case, wherein
   in a case where the state holding unit holds a state signal different from a state signal held when the auxiliary power supply and the state holding unit are electrically connected to each other by the connection unit via the current path, removal of the case from the circuit board is recorded,
   wherein
      the current path includes a first sub current path and a second sub current path independent of each other,
      the auxiliary power supply includes a battery removably provided in the case, and serving as a backup power supply of the electric circuit provided on the circuit board at off-time of the main drive power supply, and a capacitor provided on the circuit board, and charged by the main drive power supply at on-time of the main drive power supply,
      the state holding unit includes a first sub state holding unit and a second sub state holding unit in which a state signal to be held is switched when received voltage changes, and
      the connection unit includes a first sub connection unit configured to electrically connect the battery to the first sub state holding unit via the first sub current path when the circuit board is housed in the case and the battery is attached to the case, and electrically disconnect the battery from the first sub state holding unit when the circuit board is not housed in the case, and a second sub connection unit configured to electrically connect the capacitor to the second sub state holding unit via the second sub current path when the circuit board is housed in the case, and electrically disconnect the capacitor from the second sub state holding unit when the circuit board is not housed in the case.

11. A case opening recording system comprising:
   a plurality of case opening recording apparatuses provided in relation to a plurality of mechanical apparatuses;
   a communication network configured to communicably connect the case opening recording apparatuses with each other; and
   an upper controller which is communicably connected to the communication network, and configured to control an operation of each of the plurality of mechanical apparatuses,
   wherein, for each of the plurality of mechanical apparatuses,
      the mechanical apparatus has a circuit board provided with an electric circuit, and a case configured to house the circuit board,
      the case opening recording apparatus provided in relation to the mechanical apparatus is configured to record whether or not the case is removed from the circuit board,
      the case opening recording apparatus comprises:
         a current path provided in the case;
         an auxiliary power supply provided in either the circuit board or the case and different from a main drive power supply of the mechanical apparatus;
         a state holding unit in which a state signal to be held is switched when received voltage changes; and
         a connection unit configured to electrically connect the auxiliary power supply to the state holding unit via the current path when the circuit board is housed in the case, and electrically disconnect the auxiliary power supply from the state holding unit when the circuit board is not housed in the case,
      in a case where the state holding unit holds a state signal different from a state signal held when the auxiliary power supply and the state holding unit are electrically connected to each other by the connection unit via the current path, removal of the case from the circuit board is recorded,
      the current path includes a first sub current path and a second sub current path independent of each other,
      the state holding unit includes a first sub state holding unit and a second sub state holding unit, and
      the connection unit includes:
         a first sub connection unit configured to electrically connect or disconnect the auxiliary power supply to or from the first sub state holding unit via the first sub current path, for switching the state signal held in the state holding unit, and a second sub connection unit configured to electrically connect or disconnect the auxiliary power supply to or from the second sub state holding unit via the second sub current path, for switching the state signal held in the state holding unit, and wherein the upper controller has an overall recording unit configured to record, for each of the plurality of mechanical apparatuses, information indicating that the case is removed from the circuit board in the mechanical apparatus when the state holding unit of the case opening recording apparatus relevant to the mechanical apparatus holds a state signal different from a state signal held when the auxiliary power supply and the state holding unit are electrically connected to each other by the connection unit via the current path.

* * * * *